(12) United States Patent  
Lazarus et al.

(10) Patent No.: US 11,789,104 B2  
(45) Date of Patent: Oct. 17, 2023

(54) DEEP LEARNING TECHNIQUES FOR SUPPRESSING ARTEFACTS IN MAGNETIC RESONANCE IMAGES

(71) Applicant: Hyperfine Operations, Inc., Guilford, CT (US)

(72) Inventors: Carole Lazarus, Paris (FR); Prantik Kundu, Branford, CT (US); Sunli Tang, New York, NY (US); Seyed Sadegh Mohseni Salehi, Bloomfield, NJ (US); Michal Sofka, Princeton, NJ (US); Jo Schlemper, Long Island City, NY (US); Hadrien A. Dyvorne, New York, NY (US); Rafael O'Halloran, Guilford, CT (US); Laura Sacolick, Guilford, CT (US); Michael Stephen Poole, Guilford, CT (US); Jonathan M. Rothberg, Miami Beach, FL (US)

(73) Assignee: Hyperfine Operations, Inc., Guilford, CT (US)

( * ) Notice: Subject to any disclaimer, the term of this patent is extended or adjusted under 35 U.S.C. 154(b) by 0 days.

(21) Appl. No.: 16/541,511

(22) Filed: Aug. 15, 2019

(65) Prior Publication Data

US 2020/0058106 A1     Feb. 20, 2020

Related U.S. Application Data

(60) Provisional application No. 62/820,119, filed on Mar. 18, 2019, provisional application No. 62/764,742, filed on Aug. 15, 2018.

(51) Int. Cl.
*G06V 10/30*     (2022.01)
*G01R 33/56*     (2006.01)
(Continued)

(52) U.S. Cl.
CPC .......... *G01R 33/5608* (2013.01); *G06N 3/045* (2023.01); *G06T 5/002* (2013.01);
(Continued)

(58) Field of Classification Search
CPC ........... G06T 5/002; G06T 2207/10088; G06T 2207/20081; G06T 2207/20084;
(Continued)

(56) References Cited

U.S. PATENT DOCUMENTS 7,019,524 B2     3/2006  Gurr et al.
7,042,219 B2     5/2006  Biglieri et al.
(Continued)

FOREIGN PATENT DOCUMENTS

EP     2194392 A1     6/2010
EP     3467766 A1     4/2019
(Continued)

OTHER PUBLICATIONS

Han, Yoseob, Leonard Sunwoo, and Jong Chui Ye. "k-Space Deep Learning for Accelerated MRI." arXiv preprint arXiv:1805.03779 (2018). https://arxiv.org/abs/1805.03779v1 (Year: 2018).*

(Continued)

*Primary Examiner* — John Villecco
*Assistant Examiner* — Han Hoang
(74) *Attorney, Agent, or Firm* — Foley & Lardner LLP

(57) ABSTRACT

Techniques for removing artefacts, such as RF interference and/or noise, from magnetic resonance data. The techniques include: obtaining input magnetic resonance (MR) data using at least one radio-frequency (RF) coil of a magnetic resonance imaging (MRI) system; and generating an MR image from input MR data at least in part by using a neural network model to suppress at least one artefact in the input MR data.

17 Claims, 17 Drawing Sheets

(51) Int. Cl.
  *G06T 5/00* (2006.01)
  *G06N 3/045* (2023.01)
  *G06V 10/764* (2022.01)
  *G06V 10/772* (2022.01)
  *G06V 10/774* (2022.01)
  *G06V 10/82* (2022.01)
  *G06V 10/44* (2022.01)

(52) U.S. Cl.
  CPC ............ *G06V 10/30* (2022.01); *G06V 10/454* (2022.01); *G06V 10/764* (2022.01); *G06V 10/772* (2022.01); *G06V 10/774* (2022.01); *G06V 10/82* (2022.01); *G06T 2207/10088* (2013.01); *G06T 2207/20081* (2013.01); *G06T 2207/20084* (2013.01)

(58) Field of Classification Search
  CPC ...... G06T 3/4046; G06N 3/0454; G06N 3/08; G06N 3/0472; G01R 33/565; G01R 33/5608; G06K 9/6255; G06K 9/6256; G06K 9/40; G06K 9/4628; G06K 9/6273; G06K 2209/05; G01S 15/8995
  See application file for complete search history.

(56) References Cited

U.S. PATENT DOCUMENTS

| | | |
|---|---|---|
| 7,202,663 B2 | 4/2007 | Huang |
| 7,412,279 B2 | 8/2008 | Weisskoff et al. |
| 7,602,183 B2 | 10/2009 | Lustig et al. |
| 7,688,068 B2 | 3/2010 | Beatty |
| 7,881,511 B2 | 2/2011 | Ye et al. |
| 8,160,345 B2 | 4/2012 | Pavlovskaia et al. |
| 8,170,315 B2 | 5/2012 | Mistretta et al. |
| 8,354,844 B2 | 1/2013 | Zaitsev et al. |
| 8,384,383 B2 | 2/2013 | Frahm et al. |
| 8,442,285 B2 | 5/2013 | Madabhushi et al. |
| 8,473,028 B2 | 6/2013 | Mitsouras et al. |
| 8,494,905 B2 | 7/2013 | Pradeep et al. |
| 8,532,361 B2 | 9/2013 | Pavlovskaia et al. |
| 8,692,549 B2 | 4/2014 | Grady et al. |
| 8,781,197 B2 | 7/2014 | Wang et al. |
| 9,208,263 B2 | 12/2015 | Pavlovskaia et al. |
| 9,224,210 B2 | 12/2015 | Epstein et al. |
| 9,256,966 B2 | 2/2016 | Jacobs et al. |
| 9,269,127 B2 | 2/2016 | Ding et al. |
| 9,285,449 B2 | 3/2016 | Liu et al. |
| 9,396,562 B2 | 7/2016 | Lefebvre et al. |
| 9,541,616 B2 | 1/2017 | Rothberg et al. |
| 9,547,057 B2 | 1/2017 | Rearick et al. |
| 9,625,543 B2 | 4/2017 | Rearick et al. |
| 9,625,544 B2 | 4/2017 | Poole et al. |
| 9,638,773 B2 | 5/2017 | Poole et al. |
| 9,645,210 B2 | 5/2017 | McNulty et al. |
| 9,770,223 B2 | 9/2017 | Samsonov et al. |
| 9,797,971 B2 | 10/2017 | Rearick et al. |
| 9,817,093 B2 | 11/2017 | Rothberg et al. |
| 9,921,285 B2 | 3/2018 | Otazo et al. |
| 9,964,615 B2 | 5/2018 | Fuderer et al. |
| 9,965,863 B2 | 5/2018 | Xu et al. |
| 10,026,186 B2 | 7/2018 | Gerganov et al. |
| 10,073,160 B2 | 9/2018 | Boernert et al. |
| 10,139,464 B2 | 11/2018 | Rearick et al. |
| 10,145,913 B2 | 12/2018 | Hugon et al. |
| 10,145,922 B2 | 12/2018 | Rothberg et al. |
| 10,222,434 B2 | 3/2019 | Poole et al. |
| 10,222,435 B2 | 3/2019 | Mileski et al. |
| 10,241,177 B2 | 3/2019 | Poole et al. |
| 10,274,561 B2 | 4/2019 | Poole et al. |
| 10,274,563 B2 | 4/2019 | Choi |
| 10,281,540 B2 | 5/2019 | Mileski et al. |
| 10,281,541 B2 | 5/2019 | Poole et al. |
| 10,281,549 B2 | 5/2019 | Takeshima |
| 10,295,628 B2 | 5/2019 | Mileski et al. |
| 10,310,037 B2 | 6/2019 | McNulty et al. |
| 10,324,147 B2 | 6/2019 | McNulty et al. |
| 10,330,755 B2 | 6/2019 | Poole et al. |
| 10,353,030 B2 | 7/2019 | Poole et al. |
| 10,371,773 B2 | 8/2019 | Poole et al. |
| 10,379,186 B2 | 8/2019 | Rothberg et al. |
| 10,416,264 B2 | 9/2019 | Sofka et al. |
| 10,436,869 B2 | 10/2019 | Ham |
| 10,444,310 B2 | 10/2019 | Poole et al. |
| 10,466,327 B2 | 11/2019 | Rothberg et al. |
| 10,488,482 B2 | 11/2019 | Rearick et al. |
| 10,495,712 B2 | 12/2019 | Rothberg et al. |
| 10,520,566 B2 | 12/2019 | Poole et al. |
| 10,527,692 B2 | 1/2020 | McNulty et al. |
| 10,527,699 B1 | 1/2020 | Cheng et al. |
| 10,534,058 B2 | 1/2020 | Sofca et al. |
| 10,534,059 B2 | 1/2020 | Rich et al. |
| 10,539,637 B2 | 1/2020 | Poole et al. |
| 10,545,207 B2 | 1/2020 | Poole et al. |
| 10,551,452 B2 | 2/2020 | Rearick et al. |
| 10,551,458 B2 | 2/2020 | Tan et al. |
| 10,564,239 B2 | 2/2020 | Poole et al. |
| 10,588,587 B2 | 3/2020 | Samsonov et al. |
| 10,591,561 B2 | 3/2020 | Sacolick et al. |
| 10,591,567 B2 | 3/2020 | Saito et al. |
| 10,605,878 B2 | 3/2020 | Otazo et al. |
| 10,635,943 B1* | 4/2020 | Lebel ..................... G06T 5/50 |
| 10,650,532 B2 | 5/2020 | Gerganov et al. |
| 10,663,551 B2 | 5/2020 | Arunachalam |
| 10,667,691 B2 | 6/2020 | Lee et al. |
| 10,705,170 B1 | 7/2020 | Wu et al. |
| 10,709,387 B2 | 7/2020 | Poole et al. |
| 10,712,416 B1 | 7/2020 | Sandino et al. |
| 10,748,309 B2 | 8/2020 | Seevinck |
| 10,803,354 B2 | 10/2020 | Zhao et al. |
| 10,803,631 B2 | 10/2020 | Li et al. |
| 10,831,997 B2 | 11/2020 | Lin |
| 10,950,014 B2 | 3/2021 | Wheaton et al. |
| 11,185,249 B2 | 11/2021 | Schlemper et al. |
| 11,250,543 B2 | 2/2022 | Huang |
| 11,300,645 B2 | 4/2022 | Schlemper et al. |
| 11,324,418 B2 | 5/2022 | Schlemper et al. |
| 11,344,219 B2 | 5/2022 | Schlemper et al. |
| 11,346,911 B2 | 5/2022 | Daval Frerot et al. |
| 11,417,423 B2 | 8/2022 | Chen et al. |
| 2003/0194124 A1 | 10/2003 | Suzuki et al. |
| 2007/0087756 A1 | 4/2007 | Hoffberg |
| 2007/0249928 A1 | 10/2007 | Blezek et al. |
| 2013/0322723 A1 | 12/2013 | Akhbardeh et al. |
| 2016/0069968 A1 | 3/2016 | Rothberg et al. |
| 2016/0069970 A1 | 3/2016 | Rearick et al. |
| 2016/0069971 A1 | 3/2016 | McNulty et al. |
| 2016/0069972 A1 | 3/2016 | Poole et al. |
| 2016/0069975 A1 | 3/2016 | Rothberg et al. |
| 2016/0093048 A1 | 3/2016 | Cheng et al. |
| 2016/0128592 A1 | 5/2016 | Rosen et al. |
| 2016/0131727 A1 | 5/2016 | Sacolick et al. |
| 2016/0169992 A1 | 6/2016 | Rothberg et al. |
| 2016/0169993 A1 | 6/2016 | Rearick et al. |
| 2016/0223631 A1 | 8/2016 | Poole et al. |
| 2016/0231399 A1 | 8/2016 | Rothberg et al. |
| 2016/0231402 A1 | 8/2016 | Rothberg et al. |
| 2016/0231403 A1 | 8/2016 | Rothberg et al. |
| 2016/0231404 A1 | 8/2016 | Rothberg et al. |
| 2016/0275678 A1 | 9/2016 | Onal et al. |
| 2016/0299203 A1 | 10/2016 | Mileski et al. |
| 2016/0334479 A1 | 11/2016 | Poole et al. |
| 2017/0072222 A1 | 3/2017 | Siversson |
| 2017/0102443 A1 | 4/2017 | Rearick et al. |
| 2017/0227616 A1 | 8/2017 | Poole et al. |
| 2017/0276747 A1 | 9/2017 | Hugon et al. |
| 2017/0276749 A1 | 9/2017 | Hugon et al. |
| 2018/0012354 A1 | 1/2018 | Fisher |
| 2018/0018757 A1 | 1/2018 | Suzuki |
| 2018/0024208 A1 | 1/2018 | Rothberg et al. |
| 2018/0038931 A1 | 2/2018 | Rearick et al. |
| 2018/0088193 A1 | 3/2018 | Rearick et al. |
| 2018/0143274 A1 | 5/2018 | Poole et al. |
| 2018/0143275 A1 | 5/2018 | Sofka et al. |

(56) References Cited

U.S. PATENT DOCUMENTS

| | | |
|---|---|---|
| 2018/0143280 A1 | 5/2018 | Dyvorne et al. |
| 2018/0143281 A1 | 5/2018 | Sofka et al. |
| 2018/0144467 A1 | 5/2018 | Sofka et al. |
| 2018/0156881 A1 | 6/2018 | Poole et al. |
| 2018/0164390 A1 | 6/2018 | Poole et al. |
| 2018/0168527 A1 | 6/2018 | Poole et al. |
| 2018/0189930 A1 | 7/2018 | Dannels |
| 2018/0197317 A1 | 7/2018 | Cheng et al. |
| 2018/0210047 A1 | 7/2018 | Poole et al. |
| 2018/0224512 A1 | 8/2018 | Poole et al. |
| 2018/0238978 A1 | 8/2018 | McNulty et al. |
| 2018/0238980 A1 | 8/2018 | Poole et al. |
| 2018/0238981 A1 | 8/2018 | Poole et al. |
| 2018/0240219 A1 | 8/2018 | Mentl et al. |
| 2018/0285695 A1 | 10/2018 | Guo et al. |
| 2019/0004130 A1 | 1/2019 | Poole et al. |
| 2019/0011510 A1 | 1/2019 | Hugon et al. |
| 2019/0011513 A1 | 1/2019 | Poole et al. |
| 2019/0011514 A1 | 1/2019 | Poole et al. |
| 2019/0011521 A1 | 1/2019 | Sofka et al. |
| 2019/0018094 A1 | 1/2019 | Mileski et al. |
| 2019/0018095 A1 | 1/2019 | Mileski et al. |
| 2019/0018096 A1 | 1/2019 | Poole et al. |
| 2019/0025389 A1 | 1/2019 | McNulty et al. |
| 2019/0033402 A1 | 1/2019 | McNulty et al. |
| 2019/0033414 A1 | 1/2019 | Sofka et al. |
| 2019/0033415 A1 | 1/2019 | Sofka et al. |
| 2019/0033416 A1 | 1/2019 | Rothberg et al. |
| 2019/0035116 A1 | 1/2019 | Xing et al. |
| 2019/0038233 A1 | 2/2019 | Poole et al. |
| 2019/0086497 A1 | 3/2019 | Rearick et al. |
| 2019/0101605 A1 | 4/2019 | Hyun et al. |
| 2019/0101607 A1 | 4/2019 | Rothberg et al. |
| 2019/0128989 A1* | 5/2019 | Braun .............. G01R 33/56509 |
| 2019/0162806 A1 | 5/2019 | Poole et al. |
| 2019/0172230 A1* | 6/2019 | Mailhe ................... G06N 3/084 |
| 2019/0178962 A1 | 6/2019 | Poole et al. |
| 2019/0178963 A1 | 6/2019 | Poole et al. |
| 2019/0205766 A1 | 7/2019 | Krebs et al. |
| 2019/0227136 A1 | 7/2019 | Mileski et al. |
| 2019/0227137 A1 | 7/2019 | Mileski et al. |
| 2019/0236817 A1 | 8/2019 | Cheng et al. |
| 2019/0250227 A1 | 8/2019 | McNulty et al. |
| 2019/0250228 A1 | 8/2019 | McNulty et al. |
| 2019/0257903 A1 | 8/2019 | Poole et al. |
| 2019/0266761 A1 | 8/2019 | Malkiel et al. |
| 2019/0279361 A1 | 9/2019 | Meyer et al. |
| 2019/0282205 A1 | 9/2019 | Tung |
| 2019/0295294 A1 | 9/2019 | Fournie |
| 2019/0311267 A1* | 10/2019 | Qin ...................... G06N 3/0445 |
| 2019/0324098 A1 | 10/2019 | McNulty et al. |
| 2019/0340793 A1 | 11/2019 | Jin et al. |
| 2019/0353720 A1 | 11/2019 | Dyvorne et al. |
| 2019/0353723 A1 | 11/2019 | Dyvorne et al. |
| 2019/0353726 A1 | 11/2019 | Poole et al. |
| 2019/0353727 A1 | 11/2019 | Dyvorne et al. |
| 2019/0353741 A1 | 11/2019 | Bolster, Jr. et al. |
| 2019/0362522 A1 | 11/2019 | Han |
| 2020/0011952 A1 | 1/2020 | Rothberg et al. |
| 2020/0018806 A1 | 1/2020 | Rothberg et al. |
| 2020/0022611 A1 | 1/2020 | Nelson et al. |
| 2020/0022612 A1 | 1/2020 | McNulty et al. |
| 2020/0022613 A1 | 1/2020 | Nelson et al. |
| 2020/0025846 A1 | 1/2020 | Nelson et al. |
| 2020/0025851 A1 | 1/2020 | Rearick et al. |
| 2020/0033431 A1 | 1/2020 | Schlemper et al. |
| 2020/0034998 A1 | 1/2020 | Schlemper et al. |
| 2020/0041588 A1 | 2/2020 | O'Halloran et al. |
| 2020/0041597 A1 | 2/2020 | Daval Frerot et al. |
| 2020/0045112 A1 | 2/2020 | Sacolick et al. |
| 2020/0090382 A1 | 3/2020 | Huang et al. |
| 2020/0103483 A1 | 4/2020 | Hardy et al. |
| 2020/0118306 A1 | 4/2020 | Ye et al. |
| 2020/0146635 A1 | 5/2020 | Wang et al. |
| 2020/0175675 A1 | 6/2020 | Ogino et al. |
| 2020/0200844 A1 | 6/2020 | Boskamp et al. |
| 2020/0209334 A1 | 7/2020 | O'Halloran et al. |
| 2020/0249300 A1 | 8/2020 | Sandino et al. |
| 2020/0273215 A1 | 8/2020 | Wang et al. |
| 2020/0289019 A1 | 9/2020 | Schlemper et al. |
| 2020/0289022 A1 | 9/2020 | Coumans et al. |
| 2020/0294229 A1 | 9/2020 | Schlemper et al. |
| 2020/0294282 A1 | 9/2020 | Schlemper et al. |
| 2020/0294287 A1 | 9/2020 | Schlemper et al. |
| 2020/0334871 A1 | 10/2020 | Su et al. |
| 2020/0337587 A1 | 10/2020 | Sacolick et al. |
| 2020/0337591 A1 | 10/2020 | Rotman et al. |
| 2020/0341094 A1 | 10/2020 | Polak et al. |
| 2020/0341100 A1 | 10/2020 | Heukensfeldt Jansen et al. |
| 2020/0341103 A1 | 10/2020 | Akcakaya et al. |
| 2020/0355765 A1 | 11/2020 | Chen et al. |
| 2020/0355774 A1 | 11/2020 | Wang et al. |
| 2021/0003651 A1 | 1/2021 | Kamiguchi |
| 2021/0027436 A1 | 1/2021 | Banerjee et al. |
| 2021/0077060 A1 | 3/2021 | Kim |
| 2021/0090306 A1 | 3/2021 | Akcakaya et al. |
| 2021/0106251 A1 | 4/2021 | Lips et al. |
| 2021/0145393 A1 | 5/2021 | Gao et al. |
| 2021/0177296 A1 | 6/2021 | Saalbach et al. |
| 2021/0181287 A1 | 6/2021 | Sommer et al. |
| 2021/0272240 A1 | 9/2021 | Litwiller et al. |
| 2022/0015662 A1 | 1/2022 | Schlemper et al. |
| 2022/0214417 A1 | 7/2022 | Schlemper et al. |

FOREIGN PATENT DOCUMENTS

| | | |
|---|---|---|
| WO | WO 2018/045274 A1 | 3/2018 |
| WO | WO 2018/187005 A1 | 10/2018 |

OTHER PUBLICATIONS

Campbell-Washburn, Adrienne E., et al. "Using the robust principal component analysis algorithm to remove RF spike artifacts from MR images." Magnetic resonance in medicine 75.6 (2016): 2517-2525. https://onlinelibrary.wiley.com/doi/full/10.1002/mrm.25851 (Year: 2016).*

Caballero et al., Application-driven MRI: Joint reconstruction and segmentation from undersampled MRI data. International Conference on Medical Image Computing and Computer-Assisted Intervention Sep. 14, 2014:106-113.

Caballero et al., Dictionary learning and time sparsity for dynamic MR data reconstruction. IEEE transactions on medical imaging. Jan. 17, 2014;33(4):979-94.

Cordero-Grande et al., Three-dimensional motion corrected sensitivity encoding reconstruction for multi-shot multi-slice MRI: application to neonatal brain imaging. Magnetic resonance in medicine. Mar. 2018;79(3):1365-76.

Delattre et al., Spiral demystified. Magnetic resonance imaging. Jul. 1, 2010;28(6):862-81.

Fessler et al., Nonuniform fast Fourier transforms using min-max interpolation. IEEE transactions on signal processing. Jan. 22, 2003;51(2):560-74.

Fessler, On NUFFT-based gridding for non-Cartesian MRI. Journal of Magnetic Resonance. Oct. 1, 2007;188(2):191-5.

Forbes et al., Propeller MRI: clinical testing of a novel technique for quantification and compensation of head motion. Journal of Magnetic Resonance Imaging: An Official Journal of the International Society for Magnetic Resonance in Medicine. Sep. 2001;14(3):215-22.

Gal et al., Dropout as a Bayesian approximation: Representing model uncertainty in deep learning. International conference on machine learning. Jun. 11, 2016:1050-1059.

Greengard et al., Accelerating the nonuniform fast Fourier transform. SIAM review. 2004;46(3):443-54.

Griswold et al., Generalized autocalibrating partially parallel acquisitions (GRAPPA). Magnetic Resonance in Medicine: An Official Journal of the International Society for Magnetic Resonance in Medicine. Jun. 2002;47(6):1202-10.

(56) References Cited

OTHER PUBLICATIONS

Hammernik et al., Learning a variational network for reconstruction of accelerated MRI data. Magnetic resonance in medicine. Jun. 2018;79(6):3055-71.
Han et al., Deep learning with domain adaptation for accelerated projection-reconstruction MR. Magnetic resonance in medicine. Sep. 2018;80(3):1189-205.
Han et al., k-space deep learning for accelerated MRI. arXiv preprint arXiv:1805.03779. May 10, 2018;1;11 pages.
He et al., Deep residual learning for image recognition. In Proceedings of the IEEE conference on computer vision and pattern recognition 2016:770-778.
Hu et al., Squeeze-and-excitation networks. Proceedings of the IEEE conference on computer vision and pattern recognition 2018:7132-7141.
Huang et al.,. Densely connected convolutional networks. Proceedings of the IEEE conference on computer vision and pattern recognition 2017:4700-4708.
Jaderberg et al., Spatial transformer networks. Advances in neural information processing systems. 2015:1-9.
Jin et al., A general framework for compressed sensing and parallel MRI using annihilating filter based low-rank Hankel matrix. arXiv preprint arXiv:1504.00532. Dec. 30, 2015;4:32 pages.
Khalel, Edafa. GitHub. Nov. 26, 2018:3 pages. https://github.com/andrewekhalel/edafa/blob/master/README.md [last accessed Mar. 25, 2020].
Kingma et al., Adam: A method for stochastic optimization. arXiv preprint arXiv:1412.6980. Dec. 22, 2014;1:9 pages.
Knoll et al., Adapted random sampling patterns for accelerated MRI. Magnetic resonance materials in physics, biology and medicine. Feb. 1, 2011;24(1):43-50.
Knoll et al., Second order total generalized variation (TGV) for MRI. Magnetic resonance in medicine. Feb. 2011;65(2):480-91.
Lazarus et al., SPARKLING: variable-density k-space filling curves for accelerated T2*-weighted MRI. Magnetic resonance in medicine. Jun. 2019;81(6):3643-61.
Lee et al., Acceleration of MR parameter mapping using annihilating filter-based low rank Hankel matrix (ALOHA). Magnetic resonance in medicine. Dec. 2016;76(6):1848-64.
Lundervold et al., An overview of deep learning in medical imaging focusing on MRI. Zeitschrift für Medizinische Physik. May 1, 2019;29(2):102-27.
Lustig et al., Compressed sensing MRI. IEEE signal processing magazine. Mar. 21, 2008;25(2):72-82.
Mardani et al., Deep generative adversarial networks for compressed sensing automates MRI. arXiv preprint arXiv:1706.00051. May 31, 2017;1:12 pages.
Perone et al., Unsupervised domain adaptation for medical imaging segmentation with self-ensembling. NeuroImage. Jul. 1, 2019;194:1-11.
Pipe, Motion correction with Propeller MRI: application to head motion and free-breathing cardiac imaging. Magnetic Resonance in Medicine: An Official Journal of the International Society for Magnetic Resonance in Medicine. Nov. 1999;42(5):963-9.
Pluim et al., Mutual-information-based registration of medical images: a survey. IEEE transactions on medical imaging. Jul. 28, 2003;22(8):986-1004.
Pruessmann et al., SENSE: sensitivity encoding for fast MRI. Magnetic Resonance in Medicine: An Official Journal of the International Society for Magnetic Resonance in Medicine. Nov. 1999;42(5):952-62.
Qin et al., Convolutional recurrent neural networks for dynamic MR image reconstruction. arXiv preprint arXiv:1712.01751. Dec. 5, 2017;1:9 pages.
Salehi et al., Real-time deep registration with geodesic loss for Image-to-Template Rigid Registration. arXiv preprint arXiv:1803.05982. Aug. 18, 2018;4:12 pages.
Schlemper et al., A deep cascade of convolutional neural networks for dynamic MR image reconstruction. IEEE transactions on Medical Imaging. Feb. 2018;37(2):491-503.
Schlemper et al., Cardiac MR segmentation from undersampled k-space using deep latent representation learning. International Conference on Medical Image Computing and Computer-Assisted Intervention Sep. 16, 2018:259-267.
Schlemper et al., Nonuniform Variational Network: Deep Learning for Accelerated Nonuniform MR Image Reconstruction. In International Conference on Medical Image Computing and Computer-Assisted Intervention Oct. 13, 2019:57-64.
Sen et al., Compressive image super-resolution. IEEE 2009 Conference Record of the Forty-Third Asilomar Conference on Signals, Systems and Computers. Nov. 1, 2009:1235-1242.
Usman et al., Motion corrected compressed sensing for free-breathing dynamic cardiac MRI. Magnetic resonance in medicine. Aug. 2013;70(2):504-16.
Walsh et al., Adaptive reconstruction of phased array MR imagery. Magnetic Resonance in Medicine: An Official Journal of the International Society for Magnetic Resonance in Medicine. May 2000;43(5):682-90.
Wang et al., Image quality assessment: from error visibility to structural similarity. IEEE transactions on image processing. Apr. 13, 2004;13(4):600-12.
Yang et al., DAGAN: Deep de-aliasing generative adversarial networks for fast compressed sensing MRI reconstruction. IEEE transactions on medical imaging. Jun. 2018;37(6):1310-21.
Zhang et al., Coil compression for accelerated imaging with Cartesian sampling. Magnetic resonance in medicine. Feb. 2013;69(2):571-82.
Pauly., Gridding & NUFFT for Non-Cartesian Image Reconstruction. Proceedings of the International Society for Magnetic Resonance in Medicine. 2013;21:3 pages.
International Search Report and Written Opinion for International Application No. PCT/US2020/022306 dated Oct. 2, 2020.
Invitation to Pay Additional Fees for Application No. PCT/US2020/022306, dated Jul. 3, 2020.
Akcakaya et al., Utility of respiratory-navigator-rejected k-space lines for improved signal-to-noise ratio in three-dimensional cardiac MR. Magnetic resonance in medicine. Nov. 2013;70(5):1332-9.
Campbell-Washburn et al., Using the robust principal component analysis algorithm to remove RF spike artifacts from MR images. Magnetic resonance in medicine. Jun. 2016;75(6):2517-25.
Graham et al., A supervised learning approach for diffusion MRI quality control with minimal training data. NeuroImage. Sep. 1, 2018;178:668-76.
Lustig et al., SPIRiT: iterative self-consistent parallel imaging reconstruction from arbitrary k-space. Magnetic resonance in medicine. Aug. 2010;64(2):457-71.
Oksuz et al., Detection and correction of cardiac MRI motion artefacts during reconstruction from k-space. arXiv preprint arXiv:1906.05695, Jun. 12, 2019;1:1-8.
International Search Report and Written Opinion for International Application No. PCT/US2019/046649, dated Nov. 12, 2019.
Eo et al., KIKI-net: cross-domain convolutional neural networks for reconstructing undersampled magnetic resonance images. Magnetic resonance in medicine. Nov. 2018;80(5):2188-201.
Lee et al., Deep residual learning for accelerated MRI using magnitude and phase networks. IEEE Transactions on Biomedical Engineering. Apr. 2, 2018;65(9):1985-95.
Pawar et al., Moconet: Motion correction in 3D MPRAGE images using a convolutional neural network approach. arXiv preprint arXiv:1807.10831. Jul. 29, 2018: 20 pages.
Tamada et al., Method for motion artifact reduction using a convolutional neural network for dynamic contrast enhanced MRI of the liver. arXiv preprint arXiv: 1807.06956. Jul. 18, 2018:1-12.
Zhu et al., Image reconstruction by domain-transform manifold learning. Nature. Mar. 2018;555(7697):487.
Jin et al., Deep convolutional neural network for inverse problems in imaging. IEEE Transactions on Image Processing. Jun. 15, 2017;26(9):4509-22.
Lin, Python Non-Uniform Fast Fourier Transform (PyNUFFT): multi-dimensional non-Cartesian image reconstruction package for heterogeneous platforms and applications to MRI. Journal of Imaging. MDPI. Mar. 2018;4(51):22 pages.

(56) References Cited

OTHER PUBLICATIONS

Moresi et al., Miniature permanent magnet for table-top NMR. Concepts in Magnetic Resonance Part B: Magnetic Resonance Engineering: An Educational Journal. 2003;19(1):35-43.
PCT/US2019/043927, Jan. 28, 2020, International Search Report and Written Opinion.
PCT/US2019/043927, Nov. 22, 2019, Invitation to Pay Additional Fees.
U.S. Appl. No. 17,478,127, filed Sep. 17, 2021, Schlemper et al.
International Search Report and Written Opinion for Application No. PCT/US2019/043927, dated Jan. 28, 2020.
Invitation to Pay Additional Fees for Application No. PCT/US2019/043927, dated Nov. 22, 2019.
Eo et al., Supporting Information—KIKI-net: cross-domain convolutional neural networks for reconstructing undersampled magnetic resonance images. Magnetic resonance in medicine. Nov. 2018:14 pages.
Fessler, Model-based image reconstruction for MRI. IEEE Signal Processing Magazine. Jul. 1, 2010;27(4):81-9.
Lee et al., 18: An Overview of Deep Learning building blocks, Lecturer: Maruan Al-Shedivat Scribes. XP055641812. May 1, 2017:8 pages.
Ma et al., Learning traffic as images: a deep convolutional neural network for large-scale transportation network speed prediction. Sensors. 2017;17(4):818.
Shi et al., Is the deconvolution layer the same as a convolutional layer? arXiv preprint arXiv:1609.07009. Sep. 22, 2016:8 pages.
Souza et al., A hybrid frequency-domain/image-domain deep network for magnetic resonance image reconstruction. arXiv preprint arXiv:1810.12473. Oct. 30, 2018:1-8.
Tajbakhsh et al., Convolutional neural networks for medical image analysis: Full training or fine tuning? An accepted version of N. arXiv preprint arXiv:1706.0712. Jun. 2, 2017:1-17.
Wang et al., Dimension: Dynamic mr imaging with both k-space and spatial prior knowledge obtained via multi-supervised network training. MMR in Biomedicine. arXiv preprint arXiv:1810.00302. Nov. 6, 2018;4:1-13.
Zhu et al., HENet: A Highly Efficient Convolutional Neural Networks Optimized for Accuracy, Speed and Storage. arXiv preprint arXiv:1803.02742. Mar. 7, 2018:12 pages.
PCT/US2019/046649, dated Nov. 12, 2019, International Search Report and Written Opinion.
PCT/US2020/022306, dated Jul. 3, 2020, Invitation to Pay Additional Fees.
Schlemper, Jo, et al. "A deep cascade of convolutional neural networks for MR image reconstruction." https://arxiv.org/abs/1703.00555, Mar. 1, 2017. (Year: 2017).

\* cited by examiner

DEEP LEARNING TECHNIQUES FOR SUPPRESSING ARTEFACTS IN MAGNETIC RESONANCE IMAGES

CROSS-REFERENCE TO RELATED APPLICATIONS

[1] This application claims priority under 35 U.S.C. § 119(e) to U.S. Provisional Application Ser. No. 62/764,742, filed Aug. 15, 2018, and titled "MAGNETIC RESONANCE IMAGE DENOISING USING K-SPACE DEEP LEARNING MODEL," and U.S. Provisional Application Ser. No. 62/820,119, filed Mar. 18, 2019, and titled "END-TO-END LEARNABLE MR IMAGE RECONSTRUCTION", each of which is incorporated by reference in its entirety.

BACKGROUND

Magnetic resonance imaging (MRI) provides an important imaging modality for numerous applications and is widely utilized in clinical and research settings to produce images of the inside of the human body. MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to its ability to produce non-invasive images having relatively high resolution and contrast without the safety concerns of other modalities (e.g., without needing to expose the subject to ionizing radiation, such as x-rays, or introducing radioactive material into the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to conventional MRI techniques that, for a given imaging application, may include the relatively high cost of the equipment, limited availability (e.g., difficulty and expense in gaining access to clinical MRI scanners), and the length of the image acquisition process.

To increase imaging quality, the trend in clinical and research MRI has been to increase the field strength of MRI scanners to improve one or more specifications of scan time, image resolution, and image contrast, which in turn drives up costs of MRI imaging. The vast majority of installed MRI scanners operate using at least at 1.5 or 3 tesla (T), which refers to the field strength of the main magnetic field B0 of the scanner. A rough cost estimate for a clinical MRI scanner is on the order of one million dollars per tesla, which does not even factor in the substantial operation, service, and maintenance costs involved in operating such MRI scanners. Additionally, conventional high-field MRI systems typically require large superconducting magnets and associated electronics to generate a strong uniform static magnetic field (B0) in which a subject (e.g., a patient) is imaged. Superconducting magnets further require cryogenic equipment to keep the conductors in a superconducting state. The size of such systems is considerable with a typical MRI installment including multiple rooms for the magnetic components, electronics, thermal management system, and control console areas, including a specially shielded room to isolate the magnetic components of the MRI system. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but is impractical or impossible due to the above-described limitations.

SUMMARY

Some embodiments are directed to a method comprising: obtaining input magnetic resonance (MR) data using at least one radio-frequency (RF) coil of a magnetic resonance imaging (MRI) system; and generating an MR image from the input MR data at least in part by using a neural network model to suppress at least one artefact in the input MR data.

Some embodiments are directed to a system, comprising: at least one computer hardware processor; and at least one non-transitory computer-readable storage medium storing processor executable instructions that, when executed by the at least one computer hardware processor, cause the at least one computer hardware processor to perform: obtaining input magnetic resonance (MR) data using at least one radio-frequency (RF) coil of a magnetic resonance imaging (MRI) system; and generating an MR image from the input MR data at least in part by using a neural network model to suppress at least one artefact in the input MR data.

Some embodiments are directed to at least one non-transitory computer-readable storage medium storing processor executable instructions that, when executed by at least one computer hardware processor, cause the at least one computer hardware processor to perform: obtaining input magnetic resonance (MR) using at least one radio-frequency (RF) coil of a magnetic resonance imaging (MRI) system; and generating an MR image from the input MR data at least in part by using a neural network model to suppress at least one artefact in the input MR data.

Some embodiments are directed to a magnetic resonance imaging (MRI) system, comprising: a magnetics system comprising: a $B_0$ magnet configured to provide a $B_0$ field for the MRI system; gradient coils configured to provide gradient fields for the MRI system; and at least one RF coil configured to detect magnetic resonance (MR) signals; a controller configured to: control the magnetics system to acquire input MR using the at least one RF coil; and generating an MR image from the input MR data at least in part by using a neural network model to suppress at least one artefact in the input MR data.

The foregoing is a non-limiting summary of the invention, which is defined by the attached claims.

BRIEF DESCRIPTION OF THE DRAWINGS

Various aspects and embodiments of the disclosed technology will be described with reference to the following figures. It should be appreciated that the figures are not necessarily drawn to scale.

DETAILED DESCRIPTION

Figure 1A:
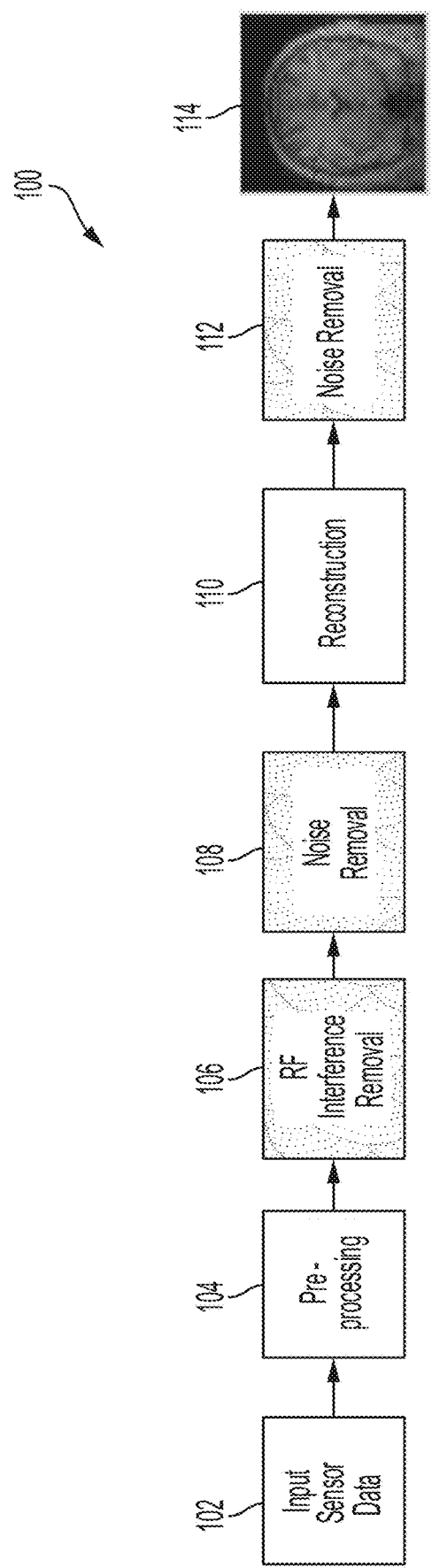
FIG. 1A illustrates an example processing pipeline for generating MR images from input MR using a neural network model to suppress one or more artefacts in the input MR data, in accordance with some embodiments of the technology described herein.

As described above, conventional clinical MRI systems are required to be located in specially shielded rooms to allow for their correct operation, which is one (among many) of the reasons contributing to the cost, lack of availability, and non-portability of currently available clinical MRI systems. In addition to protecting people and their equipment from the magnetic fields generated by an MRI system, shielded rooms prevent artefacts such as RF interference generated by various external electronic devices (e.g., other medical devices) from affecting the operation of the MRI system and the quality of the resulting images. The inventors have appreciated that to operate outside of a specially shielded room and, more particularly, to allow for generally portable, cartable, or otherwise transportable MRI, MRI systems must be capable of operation in relatively uncontrolled electromagnetic environments (e.g., in unshielded or partially shielded rooms) and must be able to account and/or compensate for the presence of interference, noise, and/or other artefacts often present in such environments.

The inventors have developed deep learning techniques for reducing or eliminating the impact of environmental artefacts such as RF interference and noise on operation of MRI systems and the quality of the images they produce. The deep learning techniques developed by the inventors allow for operation of MRI systems outside of specially shielded rooms, facilitating both portable/transportable MRI as well as fixed MRI installments that do not require specially shielded rooms. In addition, while the techniques developed by the inventors and described herein allow for operation of MRI systems outside specially shielded rooms, the techniques can also be used to mitigate the impact of interference, noise, and/or other artefacts on the operation of an MRI system in shielded environments, for example, less expensive, loose or ad-hoc shielding environments, and can therefore be used in conjunction with an area that has been fitted with limited shielding, as aspects of the technology described herein are not limited in this respect.

For example, the deep learning techniques developed by the inventors and described herein may be used to facilitate deployment of MRI systems (e.g., generally mobile, transportable or cartable systems) in a variety of settings such emergency rooms, operating rooms, intensive care units, offices, and/or clinics. These settings are particularly vulnerable to the presence of artefacts such as RF interference and noise, to which many conventional MRI systems are largely immune due to being installed in specialized rooms with extensive shielding. However, due to their cost, lack of portability, size, and shielding requirements, conventional MRI systems are simply unavailable in these settings despite the clear need for MR imaging there. The techniques developed by the inventors are especially valuable for facilitating the deployment of MRI systems in these settings.

The deep learning techniques developed by the inventors may be used to suppress (e.g., reduce and/or eliminate) artefacts from MR data obtained by any suitable type of MR scanner. For example, the techniques developed by the inventors may be used to reduce and/or eliminate artefacts from MR data collected by "low-field" MR systems, which operate at a lower field strength than the "high-field" MRI systems that dominate the MRI systems market, especially for medical or clinical MRI applications. The lower magnetic field strength of low-field MRI systems makes them especially vulnerable to the presence of RF interference, noise, and/or other artefacts, which can adversely impact the performance of such systems. For example, the deep learning techniques developed by the inventors may be used to reduce and/or eliminate artefacts from MR data obtained by any suitable type of MR scanner described herein and/or in U.S. Pat. No. "10,222,434", titled "Portable Magnetic Resonance Imaging Methods and Apparatus," which is incorporated by reference herein in its entirety, and which matured from U.S. patent application Ser. No. 15/879,254 filed on Jan. 24, 2018. It should be appreciated that the techniques described herein are not limited to being used with low-field MRI systems or any particular type of MRI systems, and may be used with high-field and/or any other suitable type of MRI systems. It should be appreciated that other machine learning techniques, aside from deep learning techniques may be employed, in some embodiments, as aspects of the technology described herein are not limited in this respect.

Many MRI systems, including some of the MRI systems described herein make use of electromagnetic shielding to reduce the impact of artefacts on the operation of the MRI system and the quality of the resulting images. Such electromagnetic shielding may be costly to install and maintain, and any mistakes or imperfections in the electromagnetic shielding may reduce the quality of the MR images produced by the MRI system. The techniques developed by the inventors and described herein may reduce the amount of electromagnetic shielding required for an MRI system, thereby reducing its cost, and may compensate for any mistakes or imperfections in the electromagnetic shielding and/or its installation.

As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." Field strengths between approximately 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field as a consequence of increased field strengths at the high end of the high-field regime. Within the low-field regime, low-field MRI systems operating with a $B_0$ field of less than 0.1 T are referred to herein as "very low-field" and low-field MRI systems operating with a $B_0$ field of less than 10 mT are referred to herein as "ultra-low field."

In some embodiments, the deep learning techniques developed by the inventors involve processing input MR spatial frequency data using a neural network model to suppress (e.g., reduce or remove the presence and/or impact of) one or more artefacts in the input MR data.

In some embodiments, the input MR data may be processed in multiple stages, one or more of which may involve suppressing artefacts in the input MR data. For example, in some embodiments, different processing stages may be used to suppress different types of artefacts (e.g., RF interference from one or more devices external to the MRI system may be suppressed in one stage and noise generated by the MR receiver chain may be suppressed in another stage). As another example, in some embodiments, multiple processing stages may be used to suppress the same type of artefact (e.g., multiple stages may be used to suppress RF interference generated by one or more devices external to the MRI system).

The circuitry involved in the processing of signals recorded by the at least one RF coil may be termed the "MR receiver chain". The MR receiver chain may include various types of circuitry such as analog circuitry (e.g., one or more amplifiers, a decoupling circuit, an RF transmit/receive switch circuit, etc.), digital circuitry (e.g., a processor) and/or any suitable combination thereof. Some examples of MR receiver chain circuitry are described in U.S. patent application Ser. No. 16/418,414, titled "Radio-Frequency Coil Signal Chain For a Low-Field MRI System", filed on May 21, 2019, which is incorporated by reference herein in its entirety.

In some embodiments, the neural network model used to suppress one or more artefacts in the input MR data may include multiple portions and each of these portions may be applied during a corresponding processing stage. For example, in some embodiments, the neural network model may include two portions—a first portion configured to suppress RF interference generated by a device external to the MRI system (also referred to herein as "external RF interference") and/or RF interference generated by one or more components of the MRI system located outside of its imaging region (also referred to herein as "internal RF interference"), and a second portion configured to suppress noise generated by circuitry in the MR receiver chain and/or noise generated by a subject (or object) being imaged. In this example, the input MR data may be processed in multiple stages one of which involves applying the first portion of the neural network to suppress (external and/or internal) RF interference and another one of which involves applying the second portion of the neural network to suppress noise generated by a subject/object being imaged. Another example is described below with reference to the processing pipeline shown in FIG. 1A, which involves a neural network having three portions applied over a (non-consecutive) sequence of three processing stages.

It should be appreciated that while the input MR data may be processed in multiple stages, not every one of these stages involves artefact suppression processing, as one or more processing stages may be used to perform functions other than artefact suppression. For example, one of the stages (e.g., stage 108 shown in FIG. 1A) may involve performing a reconstruction step by generating an image from the input MR data using any suitable reconstruction technique.

In some embodiments, the input MR data may be processed using one or more stages not in the image domain (e.g., before image reconstruction) and using one or more stages in the image domain (e.g., after image reconstruction). For example, in some embodiments, a portion of a neural network model may be applied in the sensor domain or the spatial frequency domain to suppress RF interference (e.g., during stage 106 shown in FIG. 1A) and a different portion of the neural network model may be applied in the image domain to suppress RF interference and/or noise generated by the MR receiver chain or subject (or object) being imaged (e.g., during stage 112 shown in FIG. 1A). However, it is not a requirement that artefact suppression processing be applied both before and after image reconstruction (e.g., in the sensor or spatial frequency domain and in the image domain). For example, in some embodiments artefact suppression may be performed only in before image reconstruction or only in the image domain.

Moreover, in some embodiments, artefact suppression may be performed in one or more domains other than the sensor, the spatial frequency, and image domains. In such embodiments, the data may be transformed to another domain via a suitable invertible transformation (e.g., a 1D or 2D or 3D wavelet transform, a 1D or 2D or 3D Fourier transform, a 1D or 2D or 3D short-time Fourier transform, and/or any other suitable time-frequency and/or time-scale transformation) where artefact suppression processing may be performed prior to the suitable inverse transformation is applied to the post-processed data.

Data in the "sensor domain" may comprise raw sensor measurements obtained by an MRI system. Sensor domain data may include measurements acquired line-by-line for a set of coordinates specified by a sampling pattern. A line of measurements may be termed a "readout" line. Each measurement may be a spatial frequency. As such, sensor domain data may include multiple readout lines. For example, if p readout lines were measured and each readout line included m samples, the sensor domain data may be organized in an m×p matrix. Knowing the k-space coordinates associated with each of the m×p samples, the sensor domain data may be re-organized into the corresponding k-space data, and may be then considered to be spatial frequency domain data. Image-domain data may be obtained by applying an inverse Fourier transformation (e.g., an inverse fast Fourier transform if the samples fall on a grid) to k-space data.

Accordingly, some embodiments provide for a deep learning artefact suppression technique that involves: (1) accessing MR data obtained using at least one radio-frequency (RF) coil of an MRI system; and (2) generating an MR image from input MR data at least in part by using a neural network model (e.g., a model comprising one or more convolutional layers) to suppress at least one artefact in the input MR data. In some embodiments, the first act of the deep learning artefact suppression technique may involve obtaining the input MR data using the at least one RF coil (rather than merely accessing data previously obtained using the at least one RF coil).

In some embodiments, the at least one artefact includes RF interference and generating the MR image comprises using the neural network model to suppress the RF interference. In some embodiments, the RF interference may include external RF interference generated by a device external to the MRI system. The device may be located in a same room as the MRI system and/or sufficiently close to (e.g., within a threshold distance of) the MRI system such that the electromagnetic waves generated by the device can be detected by the MRI system. The device may be a medical device, for example, a cardiac monitor, pulse oximeter, infusion pump, or other electrical equipment (e.g., transformer, motor) in the same room and/or sufficiently close to the MRI system.

In some embodiments, the RF interference may include internal RF interference generated by one or more components of the MRI system located outside of the imaging region of the MRI system. For example, internal RF interference may generated by one or more magnetics components of the MRI system (e.g., gradient coils, magnets, etc.) and/or one or more power components (e.g., one or more gradient power amplifiers, one or more power distribution units, one or more power supplies, one or more switches, one or more thermal management components, etc.). Though it should be appreciated that internal RF interference may be generated by any other component of the MRI system outside of its imaging region, aside from the above-listed components, as aspects of the technology described herein are not limited in this respect.

In some embodiments, the at least one artefact may include noise generated by the MR receiver chain and/or noise generated by a subject or object being imaged. In some embodiments, the MRI system may include at least one RF coil configured to detect MR signals in the imaging region of the MRI system.

The inventors have appreciated that certain types of artefacts may be more effectively suppressed in a domain other than the image domain, for example, the sensor domain or the spatial frequency domain (sometimes termed "k-space"). In particular, the inventors have recognized that external RF interference may be suppressed effectively in the sensor domain or the spatial frequency domain because, in these domains, external RF interference sometimes manifests as a set of complex exponential components superimposed on the detected MR signal. The inventors have recognized that suppressing such types of external RF interference can be more effectively performed in the sensor or spatial frequency domains than in the image domain.

Accordingly, in some embodiments, the neural network model used for artefact suppression comprises a first neural network portion configured to process data in a sensor or spatial frequency domain, and wherein using the neural network model to suppress the at least one artefact in the input MR spatial frequency domain data comprises processing, with the first neural network portion, sensor or spatial frequency domain data obtained from the input MR data. An example of the first neural network portion is shown in FIG. 1D, as neural network portion 150, which is described in more detail herein.

In some embodiments, the first neural network portion comprises a "U" structure in which convolutional layers are applied to successively lower-resolution versions of the data along "down-sampling path" and, then, to successively higher-resolution versions of the data along an "up-sampling path". In some embodiments, the resolution of the data may be decreased (e.g., along the down-sampling path) using one or more pooling layers and increased (e.g., along the up-sampling path) using one or more corresponding unpooling layers.

As described above, the first neural network portion may be configured to process data in the sensor or spatial frequency domain. In some embodiments, the first neural network portion may include and may be configured to process data in the sensor or spatial frequency domain using a spectral unpooling layer developed by the inventors. In some embodiments, applying the spectral unpooling layer comprises applying a pointwise multiplication layer for combining first features having a first resolution provided via a skip connection with second features having a second resolution lower than the second resolution. In some embodiments, applying the spectral unpooling layer comprises zero padding the second features prior to combining the first features with the second features using the pointwise multiplication layer. An illustrative example of the spectral pooling layer is illustrated in FIG. 1E. In some embodiments, when the first neural network portion includes a spectral unpooling layer it also includes a counterpart spectral pooling layer. In addition, the first neural network portion may include a plurality of convolutional layers, and at least one skip connection.

As described above, a neural network model may include multiple portions using for artefact suppression at different stages of processing MR data. In some embodiments, the neural network model comprises: (1) a first neural network portion configured to suppress RF interference (e.g., external and/or internal RF interference); and (2) a second neural network portion configured to suppress noise (e.g., noise generated by the MR receiver chain and/or by the subject (or object) being imaged). Each of these portions may comprise one or more convolutional layers, one or more pooling layers, and/or one or more skip connections, as aspects of the technology described herein are not limited in this respect.

For example, in some embodiments, the neural network may include a first portion configured to suppress RF interference as part of stage 106 of the processing pipeline 100 shown in the illustrative example of FIG. 1A and a second portion configured to suppress RF interference as part of stage 108 or stage 112 of the same processing pipeline.

In some embodiments, the neural network model further comprises a third neural network portion configured to suppress noise from image-domain data obtained using the input MR spatial frequency data. For example, the neural network may include a third portion as part of stage 112 of the processing pipeline 100 shown in the illustrative example of FIG. 1A.

The inventors have also developed techniques for training neural network models for artefact suppression in MR data. The techniques include generating training data by: (1) synthesizing and/or measuring RF artefact measurements; (2) synthesizing and/or measuring MR measurements; and (3) combining the obtained RF artefact and MR measurements to obtain artefact-corrupted MR data. In turn, the artefact-corrupted MR data (and the corresponding separate artefact and MR data components) may be used to train one or more neural network models for suppressing artefacts in MR data.

Accordingly, in some embodiments, the techniques for training neural networks for suppressing artefacts in MR data include: obtaining, during a first time period, RF artefact measurements using the at least one RF coil of the MRI system (e.g., when there is no MR signal in an imaging region of the MRI system), wherein the RF artefact measurements include measurements of RF interference and/or noise; obtaining, during a second time period different from the first time period, MR measurements of a subject in the imaging region of the MRI system; generating artefact-corrupted MR data by combining the RF artefact measurements with the MR measurements of the subject; and training the neural network model using the artefact-corrupted MR data.

In some embodiments, the techniques for training neural networks for suppressing artefacts in MR data include: synthesizing RF artefact measurements, wherein the RF artefact measurements include synthesized measurements of RF interference and/or noise; obtaining MR measurements of a subject in the imaging region of the MRI system; generating artefact-corrupted MR data by combining the synthesized RF artefact measurements with the MR measurements of the subject; and training the neural network model using the artefact-corrupted MR data.

In some embodiments, the techniques for training neural networks for suppressing artefacts in MR data include: obtaining RF artefact measurements using the at least one RF coil of the MRI system (e.g., when there is MR no signal in an imaging region of the MRI system), wherein the RF artefact measurements include measurements of RF interference and/or noise; synthesizing MR measurements of a subject MRI system; generating artefact-corrupted MR data by combining the obtained RF artefact measurements with the synthesized MR measurements of the subject; and training the neural network model using the artefact-corrupted MR data.

In some embodiments, the measured RF artefact measurements and/or the measured MR measurements may be measured using an MRI system to train a neural network for suppressing artefacts in MR data subsequently obtained by the same MRI system. Moreover, the RF artefact measurements and/or MR measurements may be obtained using the MRI system, when the MRI system is placed in the environment where it will be subsequently used for imaging. In this way, the training data will reflect precisely the type of interference that will likely be present during subsequent operation of the MRI system.

For example, in some embodiments, an MRI system may be calibrated for subsequent artefact suppression by: (1) placing the MRI system in an environment in which the MRI system will be used for imaging (e.g., an emergency room, an office, an operating room, a patient's room, an intensive care unit, etc.); (2) obtaining one or more measurements of the RF artefacts (e.g., measurements of external RF interference generated by medical devices in the medical facility in which the MRI system has been placed) and/or MR data in this environment; (3) using these measurements to generate training data for training a neural network for artefact suppression; (4) training the neural network using these training data (e.g., by learning at least some parameters of the neural network—either from scratch using only the training data obtained in the environment or by updating/adapting the neural network parameters to the training data obtained in the environment); and (5) using the trained neural network to suppress artefacts in MR data subsequently collected by the MRI system in the environment. In this way, the neural network may learn to suppress and/or may be adapted to suppress precisely the type of interference present in the environment during imaging.

Following below are more detailed descriptions of various concepts related to, and embodiments of, methods and apparatus for suppressing artefacts in MR data using neural networks. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1A illustrates an example data processing pipeline 100 for generating MR images from input MR data using a neural network model to suppress one or more artefacts in the input MR data, in accordance with some embodiments of the technology described herein.

As shown in FIG. 1A, data processing pipeline 100 includes multiple stages for processing input MR data 102 including: pre-processing stage 104, RF interference removal stage 106, noise removal stage 108, reconstruction stage 110, and noise removal stage 112. Applying these processing stages to the input MR spatial frequency data 102 produces an output MR image 114.

In the example of FIG. 1A, three stages (i.e., stages 106, 108, and 112) are shaded indicating that these stages perform artefact suppression processing. In the example of FIG. 1A, the stages 106 and 108 perform processing in the spatial frequency domain, whereas the stage 112 performs artefact suppression processing in the image domain. As described above, in some embodiments, any one or more of these stages may be performed in any other suitable domain. For example, in some embodiments, one or both of the stages 106 and 108 may perform artefact suppression in the sensor domain rather than in the spatial frequency domain. In such embodiments, pre-processing stage 104, which may transform the data from the sensor domain to the spatial frequency domain, may be placed between stages 108 and 110 rather than prior to stage 106 as shown in FIG. 1A.

In the example of FIG. 1A, each of stages 106, 108, and 112 suppresses artefacts in the data provided as input to the stage using a respective neural network portion. In this example, the overall neural network model comprises three portions: a first neural network portion configured to suppress RF interference in MR data as part of the processing performed during stage 106, a second neural network portion configured to suppress noise in MR data as part of the processing performed during stage 108, and a third neural portion configured to suppress noise from MR data as part of the processing performed during stage 112. In some embodiments, the three portions of the neural network model may be trained jointly (e.g., the output of one neural network portion may impact the input to another neural network portion).

Although this example involves using a data processing pipeline with three artefact suppression stages, this is not a limitation of the technology described herein. In some embodiments, the data processing pipeline may be used with any one or two of the stages 106, 108, and 112 rather than all three. Moreover, one or more artefact suppression stages may be used in addition to and/or instead of any one or two or all of the stages illustrated in the example data processing pipeline 100 of FIG. 1A.

The data processing pipeline 100 may be applied to any suitable type of input sensor data 102. The data 102 may be collected by one or multiple RF coils of an MRI system. The data 102 may be collected using a Cartesian sampling trajectory or any suitable type of non-Cartesian sampling trajectory (e.g., radial, spiral, rosette, variable density, Lissajou, etc.). The data 102 may be fully-sampled data (data collected by sampling spatial frequency space so that the corresponding Nyquist criterion is not violated). The data 102 may be under-sampled data (data containing fewer points than what is required by spatial Nyquist criteria). In some embodiments, the data 102 may exhibit artefacts due to the presence of external RF interference, internal RF interference, and/or noise generated by the MR receiver chain and/or a subject (or object) being imaged.

Initially, as part of pre-processing stage 104, one or more pre-processing steps may be applied to the input MR data 102. For example, in some embodiments, the input MR data 102 may be sensor domain data and the pre-processing stage may transform the sensor domain data (e.g., by performing a 1D Fourier transformation along the readout lines). As another example, in some embodiments, the pre-processing stage 104 may involve removing some of the input data 102. For example, some of the data 102 may be removed upon determining that the data was corrupt (e.g., due to a sensor reading indicating that the data is not reliable).

Next, as part of data processing pipeline 100 in stage 106, a first portion of the neural network model is applied to suppress (external and/or internal) RF interference in the data provided as input to stage 106.

In some embodiments, the neural network applied during stage 106 may have a "U" structure with convolutional layers being first applied to a sequence of successively lower-resolution versions of the data (along the down-sampling path) and, second, to a sequence of successively higher-resolution versions of the data (along the up-sampling path).

Figure 1B:
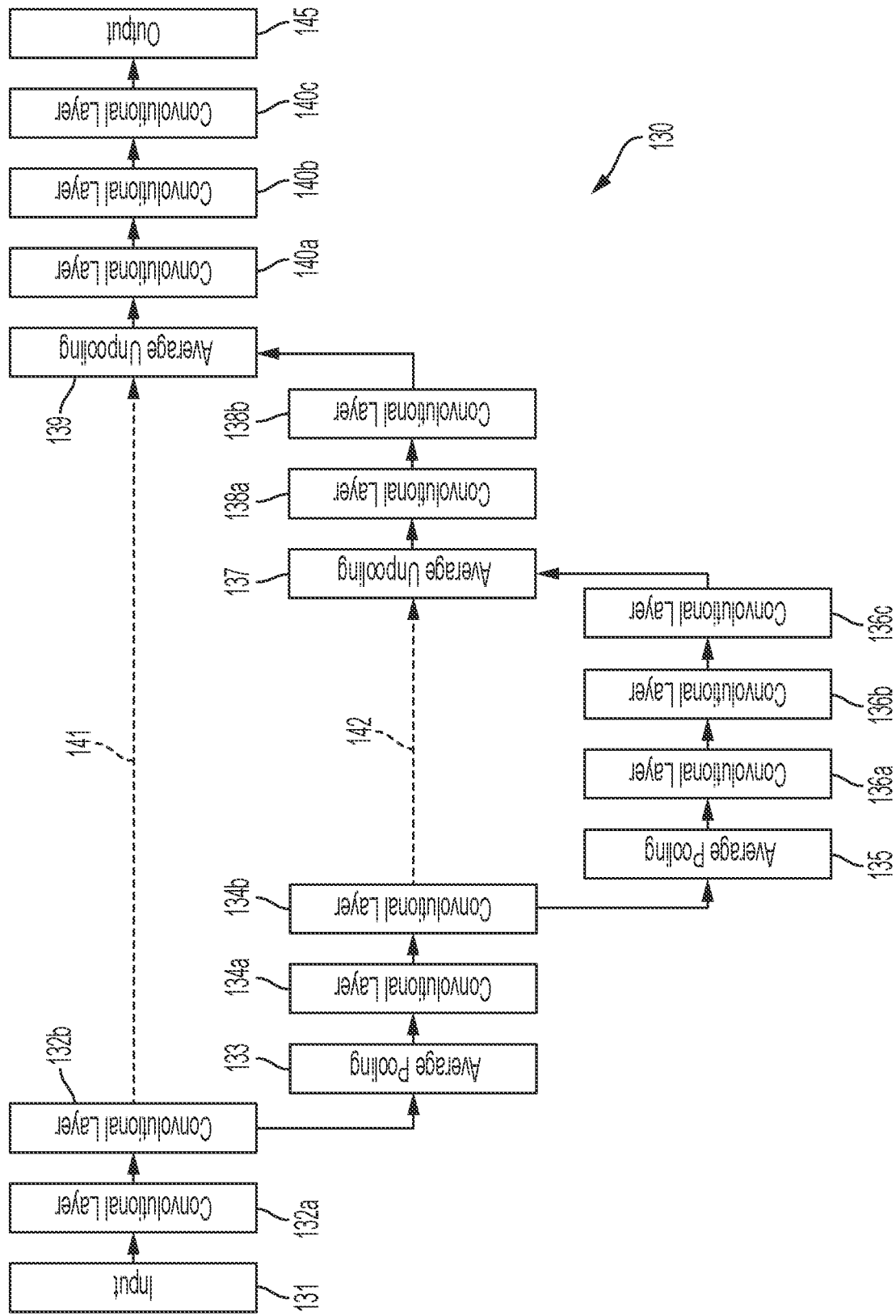
FIG. 1B illustrates the architecture of an example convolutional neural network block having a "U" structure and an average pooling layer, which block may be part of the neural network model for suppressing artefacts in the input MR data, in accordance with some embodiments of the technology described herein.

For example, the first portion of the neural network model may have the architecture 130 shown in FIG. 1B. As shown in FIG. 1B, in the down-sampling path, convolutional layers 132a and 132b are applied to input 131. An average pooling layer 133 is then applied to the output of convolutional layer 132b, and convolutional layers 134a and 134b are applied to the lower-resolution data produced by the average pooling layer 133. Next, another average pooling layer 135 is applied to the output of convolutional layer 134b, and convolutional layers 136a, 136b, and 136c are applied to the output of the average pooling layer 135.

Next, in the up-sampling path, the output of convolutional layer 136c is processed by the average unpooling layer 137. The output of the average unpooling layer 137 is processed by convolutional layers 138a and 138b. The output of convolutional layer 138b is processed by average unpooling layer 139, and the output of average unpooling layer 139 is processed by convolutional layers 140a-c to generate output 145.

The architecture 130 also includes skip connections 141 and 142, which indicates that the input to the average unpooling layers consists from output by the immediately preceding convolutional layer and output having a higher resolution generated by another (not immediately) preceding convolutional layer. For example, the input to the average unpooling layer 137 is the output of convolutional layers 134b (as indicated by the skip connection 142) and 136c. The output of convolutional layer 134b has a higher resolution than that of layer 136c. As another example, the input to the average unpooling layer 139 is the output of convolutional layers 132b (as indicated by the skip connection 142) and 138b. The output of convolutional layer 132b has a higher resolution than that of layer 138b. In this way, high frequency information that is lost through the application of pooling layers along the down-sampling path is re-introduced (and not lost) as input to the unpooling layers along the up-sampling path.

Although not expressly shown in FIG. 1B, a non-linearity layer (e.g., a rectified linear unit or ReLU, sigmoid, etc.) may be applied after one or more layers shown in the architecture 130. For example, a non-linearity layer may be applied after one or more (or each) of the convolutional layers shown in FIG. 1B. In addition, batch normalization may be applied at one or more points along the architecture 130 (e.g., at the input layer).

Figure 1C:
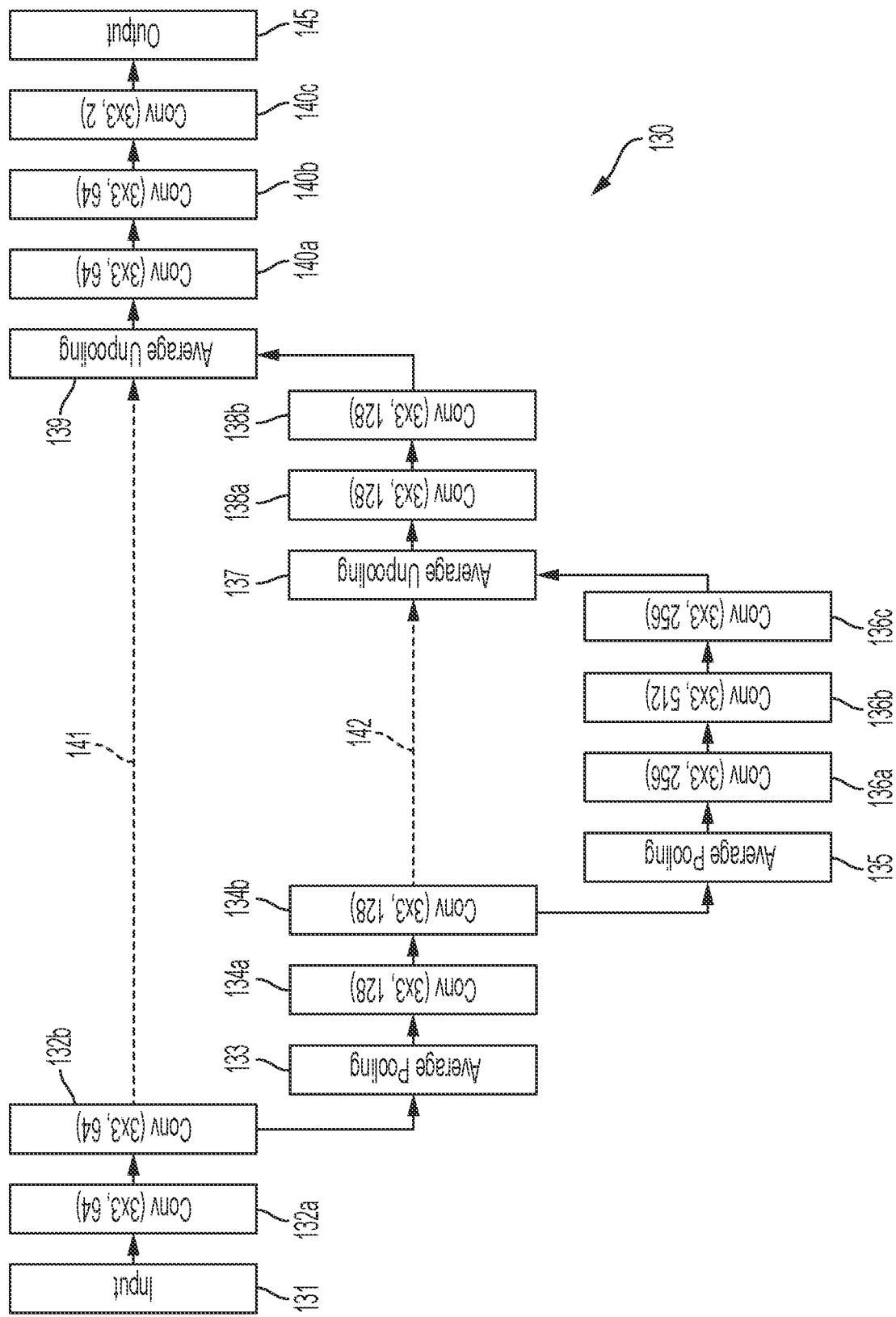
FIG. 1C illustrates a specific example of the architecture of an example convolutional neural network block shown in FIG. 1B, in accordance with some embodiments of the technology described herein.
Figure 1D:
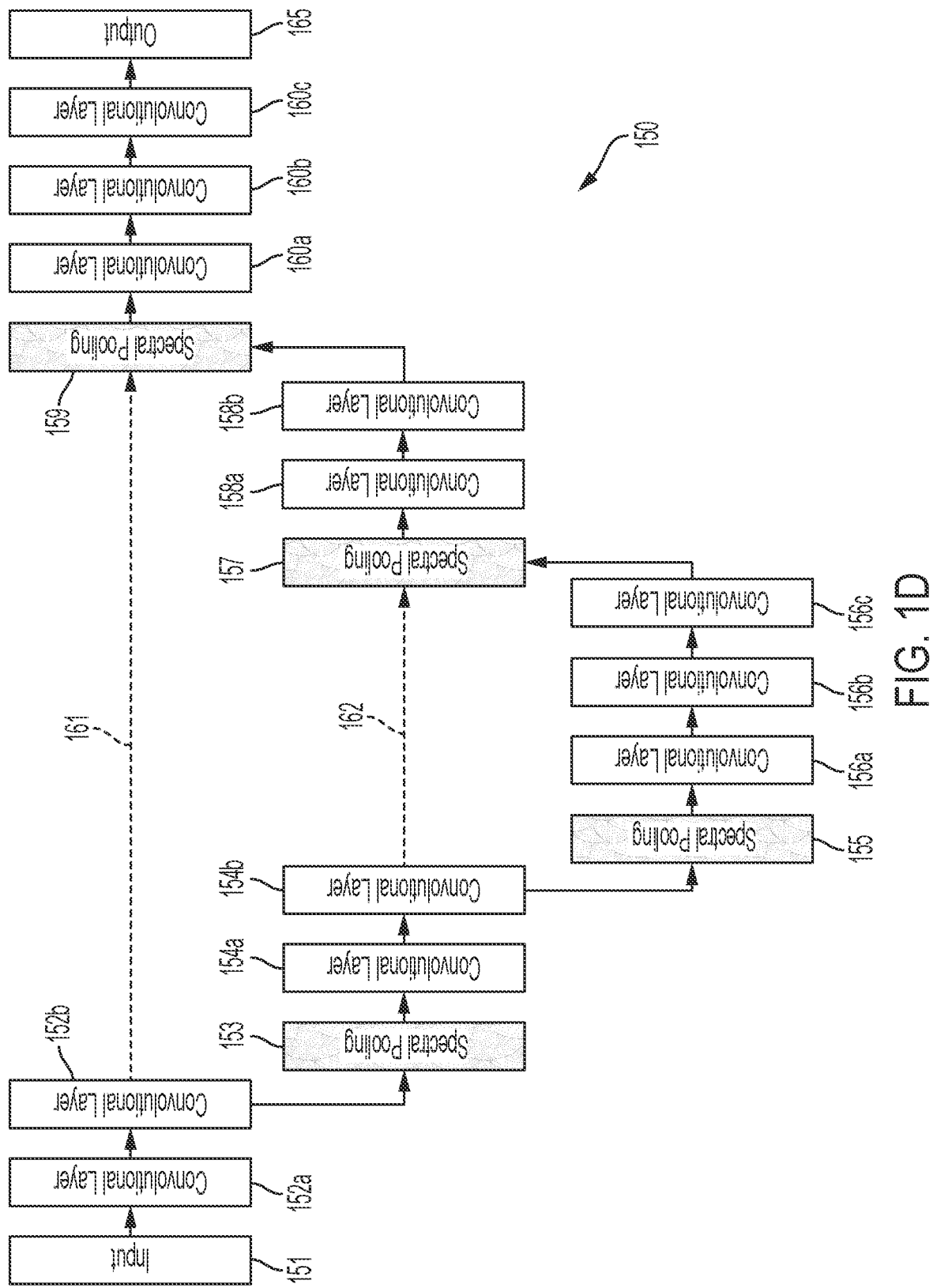
FIG. 1D illustrates the architecture of an example convolutional neural network block having a "U" structure and a spectral unpooling layer, which block may be part of the neural network model for suppressing artefacts in the input MR data, in accordance with some embodiments of the technology described herein.
Figure 1E:
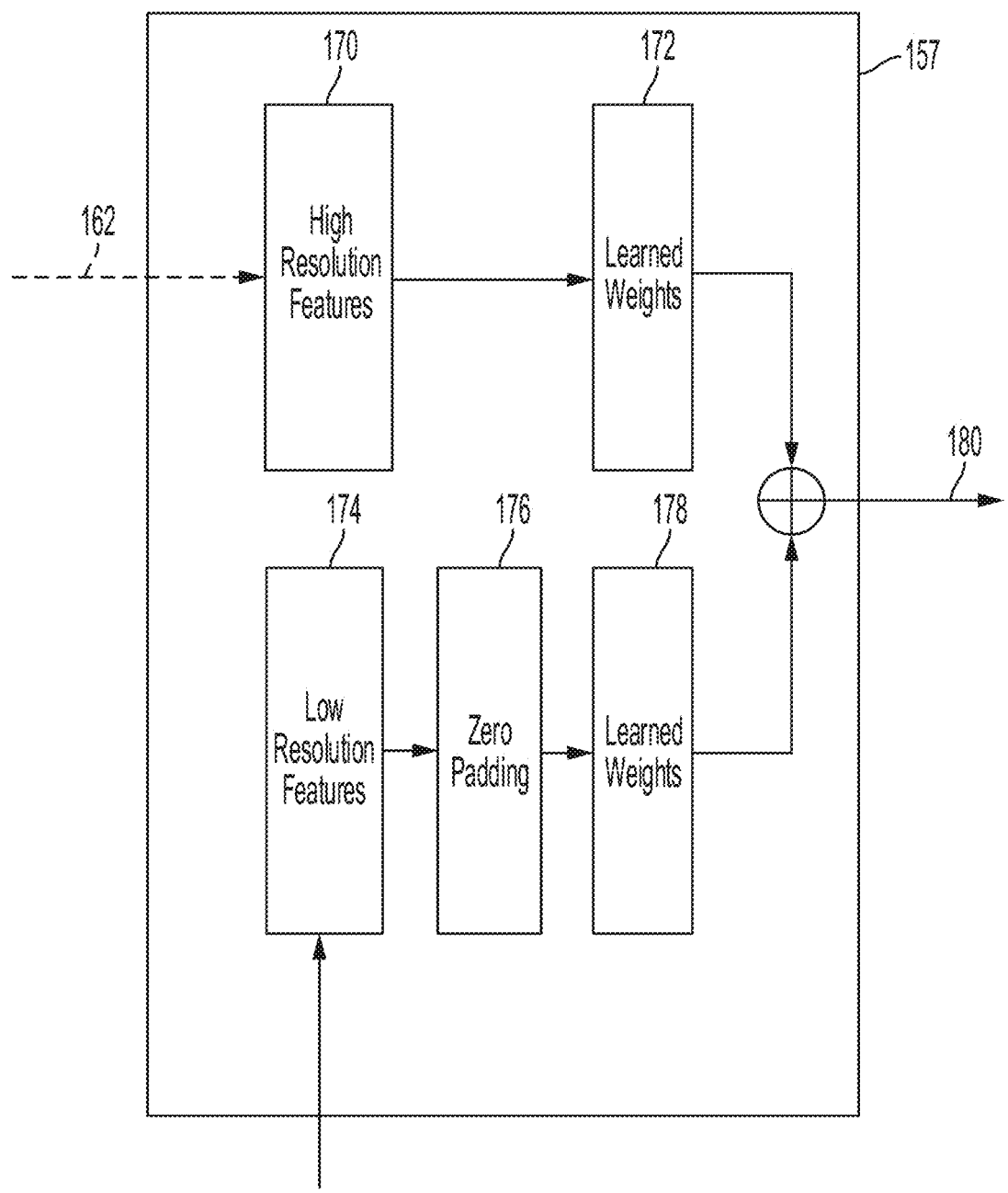
FIG. 1E illustrates the architecture of an example spectral unpooling layer, in accordance with some embodiments of the technology described herein.

FIG. 1C illustrates a specific example of the architecture of an example convolutional neural network block shown in FIG. 1B, in accordance with some embodiments of the technology described herein. As shown in FIG. 1C, all of the convolutional layers apply a 3×3 kernel. In the down-sampling path, the input at each level is processed by repeated application of two (or three at the bottom level) convolutions with 3×3 kernels, each followed by an application of a non-linearity, an average 2×2 pooling operation with stride 2 for down-sampling. At each down-sampling step the number of feature channels is doubled from 64 to 128 to 256. The number of feature channels is also doubled from 256 to 512 at the bottom layer. In the up-sampling path, the data is processed by repeated up-sampling of the feature maps using an average unpooling step that halves the number of feature channels (e.g., from 256 to 128 to 64), concatenating with the corresponding feature map from the down-sampling path and one or more convolutional layers (using 3×3 kernels), each followed by application of a non-linearity. The last convolutional layer 140c reduces the number of feature maps to 2.

As described above, the inventors have developed a new type of unpooling layer, termed a "spectral unpooling layer" herein to use for neural network models that may be applied in the sensor or spatial-frequency domain, for example, to suppress artefacts in the input MR data. For example, FIG. 1D illustrates the architecture 150 of a convolutional neural network block having a "U" structure and a spectral unpooling layer. The architecture 150 is the same as the architecture 130 shown in FIG. 1B, however, the average unpooling layers are replaced with spectral unpooling layers.

As shown in FIG. 1D, in the down-sampling path, convolutional layers 152a and 152b are applied to input 151. A spectral pooling layer 153 is then applied to the output of convolutional layer 152b, and convolutional layers 154a and 154b are applied to the lower-resolution data produced by the spectral pooling layer 153. Another spectral pooling step 155 is applied to the output of convolutional layer 154b, and convolutional layers 136a, 136b, and 136c are applied to the output of spectral pooling layer 155. In the up-sampling path, the output of convolutional layer 156c is processed by the spectral unpooling layer 157 whose output is in turn processed by convolutional layers 158a and 158b. The output of convolutional layer 158b is processed by spectral unpooling layer 159, whose output is processed by convolutional layers 160a-c to generate output 165.

In some embodiments, the spectral pooling layer may be implemented by cropping the data. This is akin to simply dropping higher spatial frequency content from the data and is very efficient to implement since the data is already in the spatial frequency domain so that it is not necessary to apply a Discrete Fourier Transform to implement the spectral pooling layer. Aspects of spectral pooling are described in Rippel, O., Snoek, J., and Adams, R. P. "Spectral representations for convolutional neural networks." In Advances in Neural Information Processing Systems, pp. 2449-2457, 2015, which is incorporated by reference herein in its entirety.

As shown in FIG. 1D, the architecture 150 also includes skip connections 161 and 162. Thus, the input to spectral unpooling layer 157 is the output of convolutional layers 154b and 156c (with the output of layer 154b including higher frequency content than the output of layer 156c). The input to spectral unpooling layer 159 is the output of convolutional layers 152b and 158b (with the output of layer 152b including higher frequency content than the output of layer 158b).

In some embodiments, the architecture 150 may be implemented in a manner analogous to the implementation of architecture 130 as shown in FIG. 1C. For example, 3×3 kernels may be used and the number of feature channels may increase from 64 to 128 to 256 to 512 along the down-sampling path and decrease from 512 to 256 to 128 to 64 and to 2 along the up-sampling path. However, it should be appreciated that any other suitable implementation (e.g., number of feature channels, kernel size, etc.) may be used, as aspects of the technology described herein are not limited in this respect.

FIG. 1E illustrates the architecture of an example spectral unpooling layer, in accordance with some embodiments of the technology described herein. In particular, FIG. 1E illustrates the architecture of spectral unpooling layer 157 part of architecture 150 shown in FIG. 1D. As shown in FIG. 1E, the output 180 of spectral unpooling layer 157 is generated from two inputs: (1) high resolution features 170 provided via skip connection 162 (from output of convolutional layer 152b as shown in FIG. 1D); and (2) low resolution features 174 provided as output from convolutional layer 158b as shown in FIG. 1D. The high resolution features 170 are so termed because they include higher (spatial) frequency content than the low resolution features 174.

In the illustrated embodiment, the spectral unpooling layer 157 combines the high resolution features and low resolution features 174 by: (1) zero padding the low resolution features 174 using zero padding block 176; and (2) computing a weighted combination of the zero-padded low-resolution features (weighted using weights 178) with the high resolution features (weighted by weights 172). In some embodiments, the weights 172 and 178 are learned from data rather than set in advance. However, in other embodiments, at least some of the weights may be set manually rather than learned from data.

As one specific example of using the spectral pooling layer, the low-resolution features 174 may include one or more (e.g., 128) feature channels each comprising 64×64 complex values and the high-resolution features may include one or more (e.g., 64) feature channels each comprising 128×128 complex values. A high-resolution 128×128 feature channel and a corresponding low-resolution 64×64 feature channel may be combined by: (1) zero padding the 64×64 feature channel to obtain a 128×128 zero-padded set of values; and (2) adding the high resolution 128×128 feature channel (weighted by weights 172) to the 128×128 zero-padded set of values (weighted by weights 178).

As described above, some neural network architectures for artefact suppression may use average pooling (and unpooling) or spectral pooling (and unpooling) layers. In other embodiments, maximum pooling (and unpooling) layers may be used. Still in other embodiments, pooling layers may be omitted altogether and longer kernel strides may be used to effectively down-sample the data, with transpose convolutional layers used to up-sample the data.

Returning to data processing pipeline 100, as shown in FIG. 1A, noise removal stage 108 follows RF interference removal stage 106. As part of stage 108, a second portion of the neural network model is applied to suppress noise in the data provided as input to stage 108. For example, the second portion of the neural network model may be used to suppress noise generated by the MR receiver chain during collection of the input MR data. As another example, the second portion of the neural network model may be used to suppress noise generated by the subject (or object) being imaged.

In some embodiments, the second portion of the neural network model may have the same or similar architecture to that of the first portion (used as part of stage 106). For example, the second portion may have a "U" structured architecture like the architectures 130 and 150 described with reference to FIGS. 1B-1E. Though it should be appreciated that one or more other architectures could be used such as, for example, a ResNet architecture comprising convolutional blocks with residual connections, as described in He K, Zhang X, Ren S, Sun J. "Deep residual learning for image recognition." In Proceedings of the IEEE conference on computer vision and pattern recognition 2016 (pp. 770-778).

As shown in the example of FIG. 1A, the noise removal stage 108 is applied in the spatial frequency domain. However, in other embodiments, the noise removal stage may be applied in another domain after suitable transformation (e.g., sensor domain, log spectral domain, time domain, spectral domain, etc.), as aspects of the technology described herein are not limited in this respect.

In some embodiments, the second portion of the neural network model may be trained jointly with the first portion of the neural network model. For example, training data may be generated such that the input to the second portion of the neural network model may be the output of the first portion of the neural network model. As a specific example, training data corrupted with both RF interference and MR receiver chain noise may be provided as input to the first portion of the neural network model and the output (with at least some of the RF interference having been suppressed by the first portion) is provided as input to the second portion of the neural network model. In other embodiments, the first and second portions may be trained independently of one another. As a specific example, training data corrupted by noise (e.g., MR receiver chain noise) but not RF interference may be used to train the second portion of the neural network model. Aspects of training the first and second neural network model portions are further described below.

As shown in FIG. 1A, the image reconstruction stage 110 follows the noise suppression stage 108. During the image reconstruction stage 110 spatial domain frequency data output by stage 108 is transformed to the image domain to generate image-domain data. The image reconstruction may be performed in any suitable way. For example, when the MR data is sampled along a Cartesian grid, the data may be transformed to the image domain using an inverse 2D (or 3D) Fourier transformation (e.g., using the inverse 2D or 3D fast Fourier transform). As another example, when the MR data is under-sampled, the data may be transformed using a gridding operation followed by an inverse Fourier transformation, an inverse non-uniform Fourier transformation, using a neural network model for reconstructing image data from non-Cartesian k-space data, using compressive sensing and/or any other suitable methods, as aspects of the technology described herein are not limited in this respect.

As one specific example, in some embodiments, where a non-Cartesian sampling trajectory is used, the MR data may be mapped to a regular grid in the spatial frequency domain (this is sometimes termed "gridding" the data) and the gridded data may be transformed to the image domain using an inverse 2D fast Fourier transform to obtain a corresponding image. A regular grid in k-space refers to a regularly-spaced grid of points in k-space such that there is a fixed distance $\Delta$ between each k-space coordinate that may be indexed. In some embodiments, the gridding may be performed by applying an interpolation matrix transformation to the data. In some embodiments, the entries of the interpolation weight matrix may be computed using an optimization approach such as, for example, the approach described in Fessler, J. A., Sutton B. P.: Non-uniform fast Fourier transforms using min-max interpolation. IEEE Transactions on Signal Processing 51(2), 560-574 (2003), which is incorporated by reference herein in its entirety. Aspects of image reconstruction in the non-Cartesian setting are described in U.S. patent application Ser. No. 16/524,598, filed on Jul. 30, 2019, titled "Deep Learning Techniques for Magnetic Resonance Image Reconstruction", which is incorporated by reference herein in its entirety.

As shown in FIG. 1A, the noise removal stage 112 follows the reconstruction stage 110. As part of the noise removal stage 112, a third portion of the neural network model is applied to suppress noise in image-domain MR data. In this example, however, unlike the first and second neural network model portions, which are applied in the spatial frequency domain, the third portion of the neural network model is applied in the image domain. The third neural network portion may have an architecture that is the same as or similar to that of the first or second portions and, for example, may have an architecture like that described in FIG. 1B-1E (with appropriate Fourier transformations employed to perform the spectral pooling and unpooling layers when such layers are employed). The third portion of the neural network model may be trained jointly with or independently from the first and second neural network model portions, as aspects of the technology described herein are not limited in this respect. Aspects of training the third portion are further described below.

As shown in FIG. 1A, the output of the noise removal stage is an MR image 114. It should be appreciated that the data processing pipeline 100 shown in FIG. 1A is illustrative and there are variations. As described, one or more of the artefact suppression stages (106, 108, and 112) may be omitted in some embodiments. As another example, one or more additional processing stages may be added to the pipeline for artefact suppression or to perform any other functionality. As another example, already described above, stages 106 and 108 may be applied in the sensor domain rather than the spatial frequency domain.

A discussion of further aspects and details of neural network models for artefact suppression, such as then neural network models illustrated in FIGS. 1A-1E follows next. It should be noted that although we described three neural network portions of a single network model above in connection with the neural network processing as part of stages 106, 108, and 112, below we may refer to the neural network portions as simply neural networks.

First, some notation is introduced. An MRI system may have one or multiple RF coils configured to detect MR signals in the imaging region of the MR system. Let the number of such RF coils be denoted by $N_C$. For each RF coil c configured to detect MR signals in the imaging region, let $s_c$ denote the detected signal. This detected signals contains three different components as follows: (1) the target MR signal data, $x_c$ for coil c; (2) the noise $n_c$ corrupting the signal (e.g., noise generated by the MR receiver chain for coil c, noise generated by the subject (or object) being imaged); and (3) external and/or internal RF interference $i_c$. Accordingly, $s_c = x_c + n_c + i_c$. Moreover, by locating $N_P$ receiver coils outside of the system we can acquire noise observed outside of the system (which is correlated with $S_c$'s) called $S_p^{nz}$. The observed signal may therefore be written as:

$$s_c = x_c + n_c + i_c = s_c^{NI} + i_c.$$

As described above, in some embodiments, a neural network model may be used to suppress the RF interference $i_c$. For example, the first portion of a neural network model used as part of stage 106 may be used to suppress the RF interference $i_c$ so as to generate $s_c^{NI}$ for each coil c. The neural network model for suppressing RF interference may be trained jointly with or independently from any other neural networks part of the data processing pipeline. In some embodiments, to train a model to suppress $i_c$, training data is created that includes all of the components of $s_c$ separately so that ground truth is available. This may be done in any suitable as described herein. For example, each of $x_c$, $n_c$ and $i_c$, may be generated synthetically using a computer-based simulation and/or observed using an MRI system. For example, to generate $i_c$ one can synthetically add structured noise lines to $s_c$ or acquire $s_c$ while no object is located inside of the system. As another example, an MRI system may have one or more RF coils outside of the imaging region that may be used to observe artefacts outside of the imaging region (without also detecting MR signals) and this coil or coils may be used to measure RF interference.

In some embodiments, the architecture of the neural network for removing RF interference may be a "U" architecture like the architectures 130 and 150 described with reference to FIGS. 1B-1E. Alternatively, a ResNet type architecture may be used where convolutional blocks have residual connections. The input to the network may be: (1) the signal $s_c$ for each coil, so that the neural network suppresses RF interference for each coil separately; (2) the signals $s_c$ for all the coils as separate channels, so that the neural network suppresses RF interference for all coils at the same time; or (3) the signals $s_c$ for each coil, as separate channels, as well as the signals $s_c^{nz}$'s as extra information in other channels (not to be suppressed, but rather to suppress RF interference in the signals $s_c$. The output produced by the neural network, corresponding to the input, may be: (1) $s_c^{NI}$ for each coil c separately; or (2) all $s_c^{NI}$'s as separate channels (when the input is of the latter two cases). Additionally, in some embodiments, the input to this block can be $s_c$ of all $N_{avg}$ averages together to incorporate even more information. In this case the output will be all denoise coil data for all averages together. This may be helpful when multiple observations by each coil is made.

Any of numerous types of loss functions may be used for training a neural network for suppressing RF interference, and various examples of loss functions are provided herein. As one example, for training a neural network for suppressing RF interference in data acquired using a single coil, the following loss function may be employed:

$$\mathcal{L}(\theta) = \|F(s_c^{NI}) - f_{CNN}(F(s_c) \mid \theta)\|_2^2 +$$
$$\|f_{CNN}(\nabla F(s_c) \mid \theta)\|_1 + \|W(s_c^{NI} - f_{CNN}(s_c \mid \theta))\|$$

where W is the weighting matrix, F is 1D Fourier transform, $\nabla$ is an image gradient, $\theta$ represents parameters of the convolutional neural network $f_{CNN}$.

In the multi-channel setting, the following loss function may be employed:

$$\mathcal{L}(\theta) = \sum_{c=1}^{N_{coil}} \left( \|F(s_c^{NI}) - f_{CNN}(F(s) \mid \theta)_c\|_2^2 + \right.$$
$$\left. \|f_{CNN}(\nabla F(s) \mid \theta)_c\|_1 + \|W(s_c^{NI} - f_{CNN}(s \mid \theta)_c)\| \right)$$

where $N_{coil}$ is the number of coils and $f_{CNN}(S)_c$ is denoised sensor data for coil c.

As described above, in some embodiments, a neural network may be used to suppress the RF interference $i_c$ (e.g., as part of stage 106 of pipeline 100) and another neural network may be used to suppress noise $n_c$ (e.g., as part of stage 108 of pipeline 100). As described herein, the architecture of the neural network for suppressing $n_c$ may be the same as or similar to that used for suppressing RF interference $i_c$ (e.g., a "U" structured network, a ResNet structured network, and/or any of the architectures described with reference to FIGS. 1B-1E).

In some embodiments, the input to the noise removal neural network may be: (1) $s_c$ for suppressing noise from each coil c separately; (2) all $s_c$'s as separate channels, for suppressing noise in all coils at the same time; (3) all $s_c$'s as separate channels as well as the data detected by coils outside of the imaging region ($s_p^{nz}$) as an additional information to use for denoising. In some embodiments, the output of the trained neural network may be: (1) $x_c$ or (2) all $x_c$'s for the multiple coils.

Any of numerous types of loss functions may be used for training a neural network for suppressing noise, and various examples of loss functions are provided herein. As one example, for training a neural network for suppressing noise in data acquired using a single coil, the following loss function may be employed:

$$\mathcal{L}(\theta) =$$
$$\|F(x) - f_{CNN}(F(s_c) \mid \theta)\|_2^2 + \|f_{CNN}(\nabla F(s_c) \mid \theta)\|_1 + \|W(x_c - f_{CNN}(s_c \mid \theta))\|$$

In some embodiments, when training a neural network for suppressing noise in data acquired using multiple coils, the following loss function may be employed:

$$\mathcal{L}(\theta) = \sum_{c=1}^{N_{coil}} \left( \|F(x_c) - f_{CNN}(F(s) \mid \theta)_c\|_2^2 + \right.$$
$$\left. \|f_{CNN}(\nabla F(s) \mid \theta)\|_1 + \|W(x_c - f_{CNN}(s \mid \theta)_c)\| \right)$$

As described above, in some embodiments, a neural network may be used to suppress artefacts in the image domain (e.g., as part of stage 112 of pipeline 100). As described herein, the architecture of this neural network may be the same as or similar to that of other neural networks described herein (e.g., a "U" structured network, a ResNet structured network, and/or any of the architectures described with reference to FIGS. 1B-1E).

Suppressing artefacts in the image domain may facilitate reducing or removing noise generated by the acquisition system (e.g., MR receiver chain). The effects of such noise are more pronounced in low-field MRI system leading to a lower signal to noise ratio. Conventional techniques for suppressing noise in MR images involve using parametric filtering techniques such as anisotropic diffusion or non-local means filtering. The goal of these parametric filtering techniques is to remove noise in uniform image regions while preserving sharpness of the edges around anatomical structures. When the level of noise is high (as in low-field systems), applying the parametric filters typically results in smooth-looking images with loss of detail in low-contrast image regions. By contrast, using deep learning to suppress artefacts (e.g., noise) in the image domain using the techniques developed by the inventors results in sharp-looking images while preserving structure even in low-contrast regions.

The neural network architecture used to suppress artefacts in the image domain may be any of the architectures described herein and, for example, may be a convolutional neural network having convolutional blocks with residual connections (like in the ResNet architecture), a "U" structure like described with reference to FIGS. 1B-1E or any other suitable structure.

In some embodiments, training data may be created to reflect the effect of noise on MR images. The noise may be measured (e.g., using an MRI system) or synthesized. For example, a synthetic noise signal $e_c$ may be added to the image $x_c$ as follows: $x_c'' = x_c + e_c$, where the noise may be drawing from a Gaussian $e_c \sim N(0, \sigma_c)$ or Ricean distribution, (assuming there is no correlation among coils for simplicity).

In some embodiments, the neural network for suppressing artefacts in the image domain may be trained, given a dataset $\mathcal{D}$, using content loss (structural similarity index (SSIM) loss or mean squared error loss) and an adversarial loss given by:

$$\mathcal{L}(\theta_G, \theta_D) = \sum_{i=1}^{|\mathcal{D}|} -D_{\theta_D}(G_{\theta_G}(x_c), x_c^n) + \lambda(1 - SSIM(x_c, x_c^n)).$$

In the above expression for loss, the generator G is the filtering network and the discriminator D is trained to best differentiate between images filtered with the network G and original noise-free images (ground truth). In some embodiments, the parameters of the generator ($\theta_G$) and discriminator ($\theta_D$) neural networks may be optimized by establishing a minimax game between the generator and discriminator neural networks. The generator network may be trained to produce filtered images as close as possible to the ground truth and thus fool the discriminator neural network. On the other hand, the discriminator network may be trained to classify the input images as filtered or ground truth. Using an adversarial loss, like the one described above, helps to achieve sharp-looking filtered images while preserving structures even in low-contrast regions.

In some embodiments, the neural network for suppressing artefacts in the image domain may be trained jointly with or independently from any other artefact suppression networks. In the former case, input into the neural network may be the final reconstructed image (e.g., generated by reconstruction stage 110) and the network may be trained using the target image x. In some embodiments, the network may be trained using target $x_0$, before resizing. This way, the filtering will learn to upsample the image in an optimal way.

Next, we discuss an illustrative example of applying a neural network to suppress RF interference in the spatial frequency domain, according to some embodiments of the technology described herein.

The inventors have appreciated that, in some instances, RF interference may manifest itself as one or more bright, zipper-like scratches in the image along the phase encoding direction because the interference captured in the spatial frequency domain the frequency components of interference are usually consistent through scanning. Image recovery of regions corrupted by zipper-like artifacts is challenging since their appearance has complicated structure which oftentimes may significantly degrade the underlying image in the image domain. In k-space domain, however, although the noise is not localized as in the image domain and thus more regions are affected, the corruption is not as destructive because the noise frequency components with small amplitude are superimposed onto the signal data with much larger amplitude.

Figure 2A:
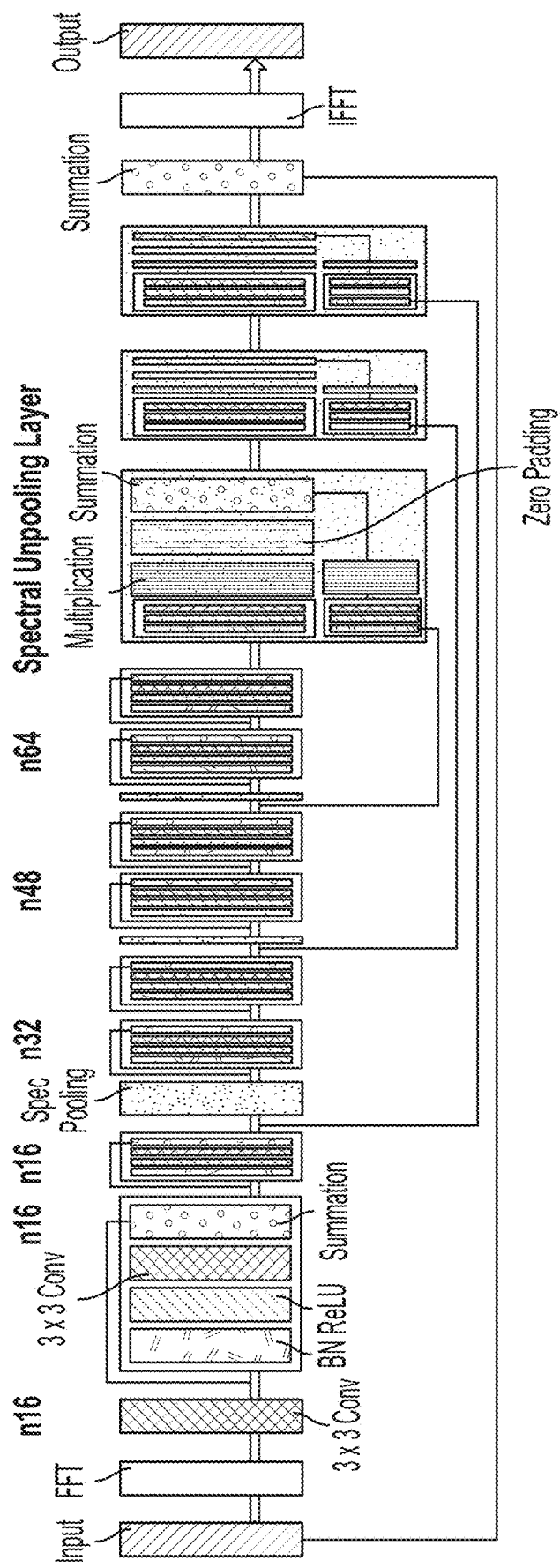
FIG. 2A illustrates the architecture of an example neural network, having a spectral unpooling layer, for suppressing RF interference in input MR data, in accordance with some embodiments of the technology described herein.

FIG. 2A illustrates the architecture of an example neural network, having a spectral unpooling layer, for suppressing RF interference in MR data, in accordance with some embodiments of the technology described herein. The neural network of FIG. 2A implements a version of the architecture described with reference to FIGS. 1D and 1E.

In particular, the neural network of FIG. 2A includes multiple convolutional residual blocks (e.g., n=8) that serve as learned interpolation filters. In the down-sampling path, after every two convolutional blocks, a spectral pooling operation is applied to project the data onto a lower-dimensional frequency basis. In the up-sampling path, a spectral unpooling layer is used to up-sample the lower-level k-space features and combine them with higher-level features (from skip connections). In this example, the spectral unpooling layer applies convolution, batch normalization, ReLU and pointwise multiplication layer (with learned coefficients) on both lower-level and higher-level features (skips). The lower-level features are then zero-padded and added to the processed skips.

In the particular implementation of FIG. 2A, the input image is resized into 128×128 blocks. In down-sampling path, spectral pooling reduces the height and width of each activation by two; the convolutional layers utilize 3-by-3 kernels with output dimension 16 (before first spectral pooling), 32 (between the first and second spectral pooling), 48 (between the second and last spectral pooling) and 64 (after the last spectral pooling) respectively. In the up-sampling path part, the size of convolutional kernel is 1-by-1 and the output dimension is the same as input dimension.

In this example, the neural network of FIG. 2A is trained (in some instances using the Adam optimizer with learning rate 0.001) using a loss function composed of k-space loss (k-space MSE and conjugate symmetry loss) and image domain loss (structured similarity index). Specifically, we define the loss as $L(y, \hat{y})=\|F(y)-F(\hat{y})\|^2+\lambda_c L_{conj}(F(\hat{y}))+\lambda_s(1-SSIM(y, \hat{y}))$, where y is the target image, $\hat{y}$ is the denoised image, F is the Fourier transform, $L_{conj}$ is the conjugate symmetry loss and SSIM is defined in the same way as in Wang, Z., Bovik, A. C., Sheikh, H. R., Simoncelli, E. P.: "Image quality assessment: from error visibility to structural similarity." IEEE Transactions on Image Processing 13(4), 600-612 (2004). Using this type of k-space loss helps to suppress the zipper artifacts while the structural similarity index ensures that the images are sharp.

Figure 2B:
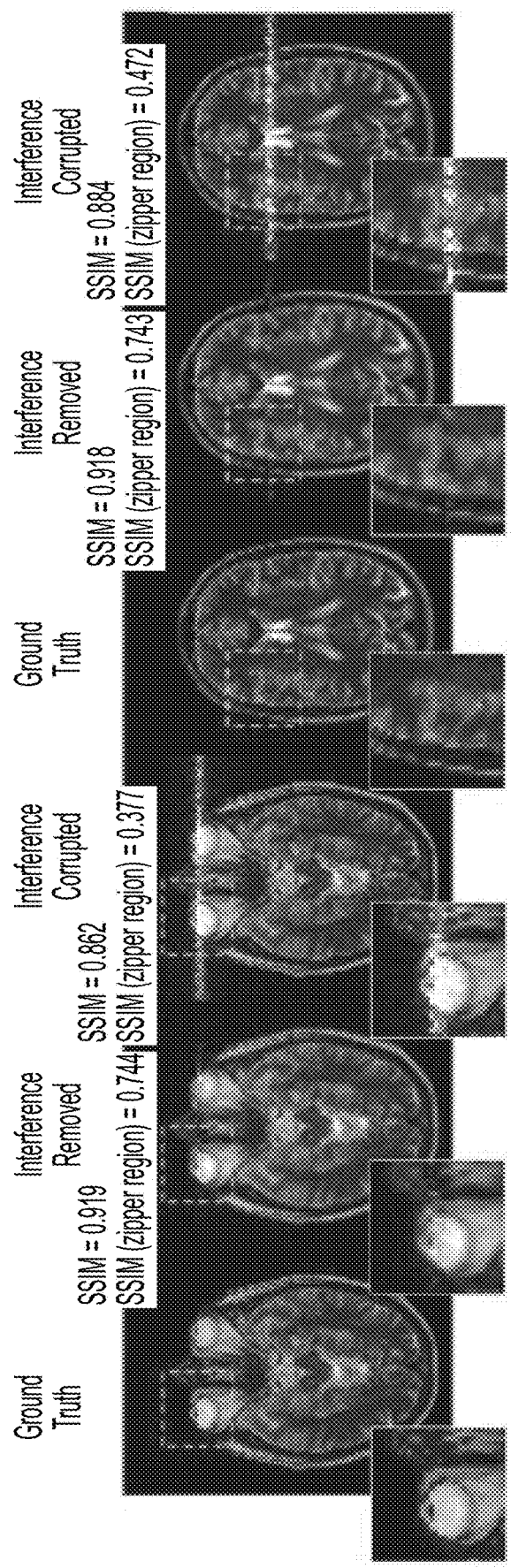
FIG. 2B illustrates application the example neural network shown in FIG. 2A to suppressing RF interference in MR data, in accordance with some embodiments of the technology described herein.

In the example of FIGS. 2A and 2B, the neural network of FIG. 2A was trained using a database of interference-corrupted images for input paired with interference-free data as target ground truth. The interference-free images were corrupted with RF interference synthesized using a generative statistical model. In this example, the inventors have appreciated that the RF interference has a specific structure, which may be modeled by equation $\hat{f}(k_x, k_y)=\Sigma_{m=0}^{M}\alpha_m e^{-\pi i \beta_m k_y}+\in(k_x, k_y)$, where $\alpha_m$ is the intensity of interference, $\beta_m$ determines the position of interference noise in image space and $\in$ is an additional Gaussian noise. The corrupted and the original interference-free images were then used to train the neural network.

FIG. 2B illustrates application the example neural network shown in FIG. 2A to suppressing RF interference in MR images, in accordance with some embodiments of the technology described herein. The network of FIG. 2A was trained with $\lambda_c=1e-5$, $\lambda_s=1e-2$ in loss function and M~Uniform(0,60), $\alpha_m$~Uniform(0,1) and $\beta_m$~Uniform(0,1) in degrading function. The neural network was trained for 1000 epochs with 8192 volumes per epoch and with batch size 64.

FIG. 2B shows, for each of two different MR images, the following three images: (1) the ground truth (original image without interference); (2) the interference-corrupted MR image; and (3) a cleaned-up image obtained by using the model of FIG. 2A to suppress the RF interference. The results show that the model suppresses the zipper lines in the corrupted image and at the same time preserves the other brain features. For the two slices shown in FIG. 2B, the overall SSIM is enhanced from 0.862 to 0.919 and from 0.884 to 0.918 respectively; for the region affected by interference noise (20 nearest pixels to interference line in vertical direction), SSIM is dramatically improved from 0.377 to 0.744 and from 0.472 to 0.743.

Figure 3:
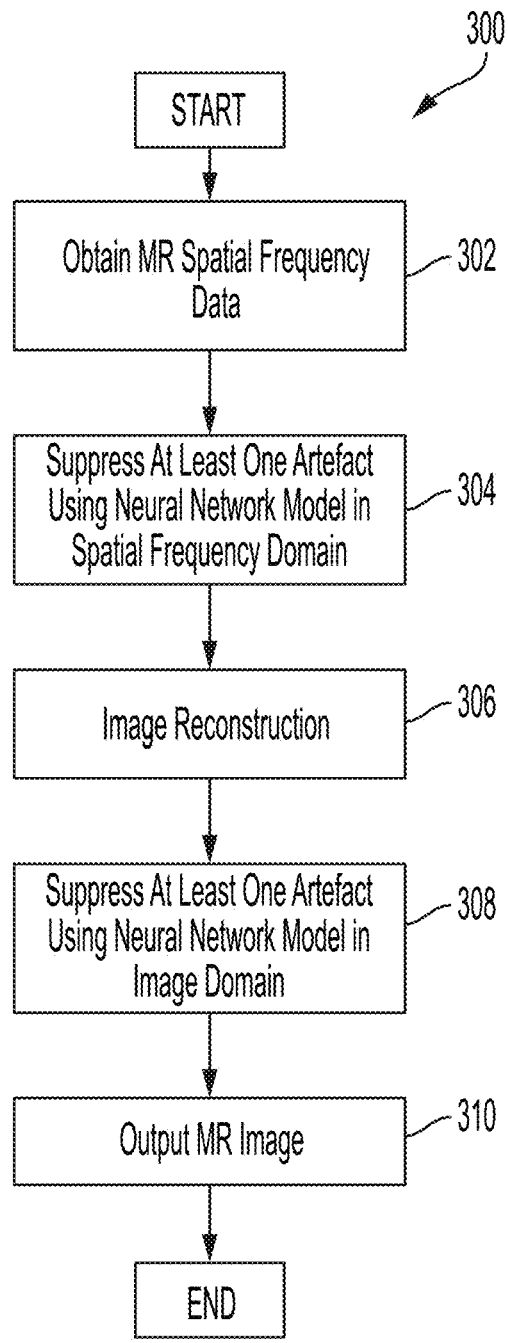
FIG. 3 is a flowchart of an illustrative process 300 for suppressing one or more artefacts in MR data using a neural network model, in accordance with some embodiments of the technology described herein.

FIG. 3 is a flowchart of an illustrative process 300 for suppressing one or more artefacts present in input MR data using a neural network model, in accordance with some embodiments of the technology described herein. Process 300 may be executed using any suitable computing device. For example, in some embodiments, the process 300 may be performed by a computing device co-located (e.g., in the same room) with an MRI system that obtained the MR data by imaging a subject (or object). As another example, in some embodiments, the process 300 may be performed by one or more processors located remotely from the MRI system (e.g., as part of a cloud computing environment) that obtained the input MR data.

Process 300 begins at act 302, where input MR data is obtained. In some embodiments, the input MR data had been previously obtained by an MRI system and stored for subsequent analysis, so that it is accessed at act 302. In other embodiments, the input MR data may be obtained by an MRI system (including any of the MRI systems described herein) as part of process 300. In some embodiments, the data may have been obtained using a Cartesian sampling trajectory. In other embodiments, the data may have been obtained using a non-Cartesian sampling trajectory, examples of which are provided herein.

After one or more pre-processing steps, which may be optional and may involve transforming the input MR data from the sensor domain to the spatial frequency domain, as described above, process 300 moves to act 304 where at least one artefact is suppressed, in the spatial frequency domain, using a neural network model.

In some embodiments, spatial frequency domain processing is performed in two stages. For example, during the one stage, a first portion of the neural network model may be used to suppress RF interference in the spatial frequency domain, as described herein including with reference to stage 106 of processing pipeline 100, and FIGS. 1A-1E and 2A-2B. Then, during another (immediately following, in some embodiments) stage, noise may be suppressed in the MR data in the spatial frequency domain, as described herein including with reference to stage 108 of processing pipeline 100, and FIGS. 1A-1E. In other embodiments, however, a different number of artefact suppression stages may be used (e.g., one, three, four, five, etc.), as aspects of the technology described herein are not limited in this respect. For example, in some embodiments, a single artefact suppression stage may be used at act 304 to simultaneously suppress RF interference and noise in the spatial frequency domain.

Next, process 300 moves to act 306, where image reconstruction is performed to transform spatial domain MR data to image domain data. The reconstruction may be performed in any suitable way. For example, when the spatial frequency domain data is spaced on a Cartesian grid, the data may be transformed using an inverse 2D Fourier transformation (e.g., using the inverse 2D fast Fourier transform). As another example, when the spatial frequency domain data is under-sampled, the data may be transformed using an inverse non-uniform Fourier transformation, using a neural network model for reconstructing image data from non-Cartesian k-space data, using compressive sensing and/or any other suitable methods, as aspects of the technology described herein are not limited in this respect.

Next, process 300 moves to act 308, where a neural network model is applied to suppress artefacts present in the image obtained at act 306. The neural network model may be applied in the image domain and may have any suitable architecture including any of the architectures described herein. In some embodiments, the processing at act 308 may be performed, as described herein including with reference to stage 112 of processing pipeline 100, and FIGS. 1A-1E. After act 308 completes, process 300 moves to act 310 where the resultant MR image is output (e.g., saved for subsequent access, transmitted to a recipient over a network, etc.).

In some embodiments, as part of process 300, a neural network model having three portions may be employed. The first portion may be configured to suppress RF interference in the spatial frequency domain. The second portion may be configured to suppress noise in the spatial frequency domain. The third portion may be configured to suppress noise in the image domain. These portions may be trained jointly or independently of one another. In some embodiments, all three portions are used, but in other embodiments one or two of these portions may be omitted.

In the illustrative example of FIG. 3, act 304 involves suppressing artefacts in MR data in the spatial frequency domain. However, in other embodiments, artefacts may be suppressed in the sensor domain or any other suitable domain, as aspects of the technology described herein are not limited in this respect.

Additional aspects of training the neural network models described above are discussed next.

In some embodiments, a residual training strategy may be employed to train neural networks to suppress artefacts from training data corrupted with them. As part of such a residual training strategy the input data may include the superposition of a signal of interest (e.g., an MR signal) with undesired artefacts (e.g., RF interference, noise, etc.) that corrupt the signal of interest. The target data may be the undesired artefact data (e.g., the RF interference signal that was added to an MR signal of interest to generate the input data). The output data is then the undesired artefact (e.g., the RF interference signal)—the aim is therefore to estimate the undesired artefact data rather than the clean MR signal. This approach is sometimes termed "residual training". A neural network model trained in this way is focused on learning differences among data with and without artefacts rather than on learning to generate artefact-free data, which helps in convergence during training.

In some embodiments, one or a linear combination of multiple loss functions may be employed to train the neural network models described herein:

L2 loss between output and target data

L1 loss between output and target data

L2 weighted loss between output and target data. The weights may be calculated based on the k-space coordinates. The higher the spatial frequency (the farther from the center of k-space), the higher the weight. Using such weights causes the resulting model to keep the high spatial frequencies which are noisier than the low frequencies L1 weighted regularization on the output. A sparse prior may be enforce on the output of the neural network by using the $l_1$ norm, optionally after weighting. The weights may be calculated based on the k-space coordinates. The higher the spatial frequency (far from the center of k-space), the smaller the weight. This encourages sparsity.

Generative Adversarial Nets loss

Structured similarity index loss

Any of the other loss functions described herein including in connection with FIGS. 1A-1E and 2A-2B.

It should be appreciated that the loss functions described herein may be computed in any suitable domain (e.g., sensor domain, k-space domain, image domain) or any representation (e.g., after weighting) regardless of the domain in which the neural network operates. For example, a neural network designed to operate on spatial frequency data may take spatial frequency data as input and produce spatial frequency data as output, but during training its loss function may be calculated in the image domain (e.g., after a suitable transformation of the data with a Fourier transformation). This is helpful since some loss functions may not be straightforward or possible to compute in one domain, but may be easier to compute in another domain (e.g., it is natural to calculate the SSIM lost in the image domain). As a consequence, the input data may be transformed using any suitable transform (e.g., by gridding into k-space and/or performing Fourier transformation) prior to application of a neural network.

Any suitable optimization technique may be used for estimating neural network parameters from data. For example, one or more of the following optimization techniques may be used: stochastic gradient descent (SGD), mini-batch gradient descent, momentum SGD, Nesterov accelerated gradient, Adagrad, Adadelta, RMSprop, Adaptive Moment Estimation (Adam), AdaMax, Nesterov-accelerated Adaptive Moment Estimation (Nadam), AMSGrad.

In some embodiments, the training data used for training the neural network models described herein may be obtained by: (1) synthesizing and/or measuring RF artefact measurements; (2) synthesizing and/or measuring MR measurements; and (3) combining the obtained RF artefact and MR measurements to obtain artefact-corrupted MR data. In turn, the artefact-corrupted MR data (and the corresponding separate artefact and MR data components) may be used to train one or more neural network models for suppressing artefacts in MR data.

In some embodiments, the synthesized and/or measured RF artefact measurements may represent various sources of interference and/or noise. For example, the synthesized and/or measured RF artefact measurements may represent external RF interference generated by one or more electronic devices including, but not limited to, computers, monitors, cell phones, Bluetooth devices, medical devices (e.g., EEG, ECG, pulse oximeters, cardiac monitors, blood pressure cuff, etc.), transformers, motors, pumps, fans, and ventilators. As another example, the synthesized and/or measured RF artefact measurements may represent internal RF interference generated by power components and/or magnetic components of an MRI system (e.g., gradient coils, power amplifiers, etc.). Such interference may manifest itself in a predictable manner—as a function of the pulse sequence employed for imaging. Such interference may be measured effectively during operation of the MRI system using one or more pulse sequences. As another example, the synthesized and/or measured RF artefact measurements may represent noise generated by the MR receiver chain or the subject (or object) being imaged.

In some embodiments, RF artefact measurements may be obtained using any sensor configured to capture directly or indirectly any RF artefacts present in the environment of an MRI system. Such sensor may include MRI system sensors themselves (e.g., one or more RF coils) and/or any auxiliary sensors, which may be near the MRI system or even in other locations (e.g., other rooms of a hospital).

In some embodiments, RF artefact measurements may be obtained by one or more sensors while the MRI system executes one or more pulse sequences during an MR acquisition with a subject (or object) present in the imaging region, or without a subject (or object) present in the imaging region of the MRI system. For example, in some embodiments, RF artefacts may be measured by one or more sensors without sending out any RF excitation pulses (which avoids the generation of an MR signal).

In some embodiments, the manner of obtaining RF artefact measurements may be based on one or more characteristics of a pulse sequence (e.g., sampling rate, readout duration, repetition time, etc.). For example, in some embodiments, the RF artefact measurements may be acquired by one or more sensors at a sampling rate and readout duration that is consistent with a pulse sequence of interest. In some embodiments, the repetition time between successive artefact measures may be consistent with the pulse sequence and may match its repetition time (TR).

Figure 4A:
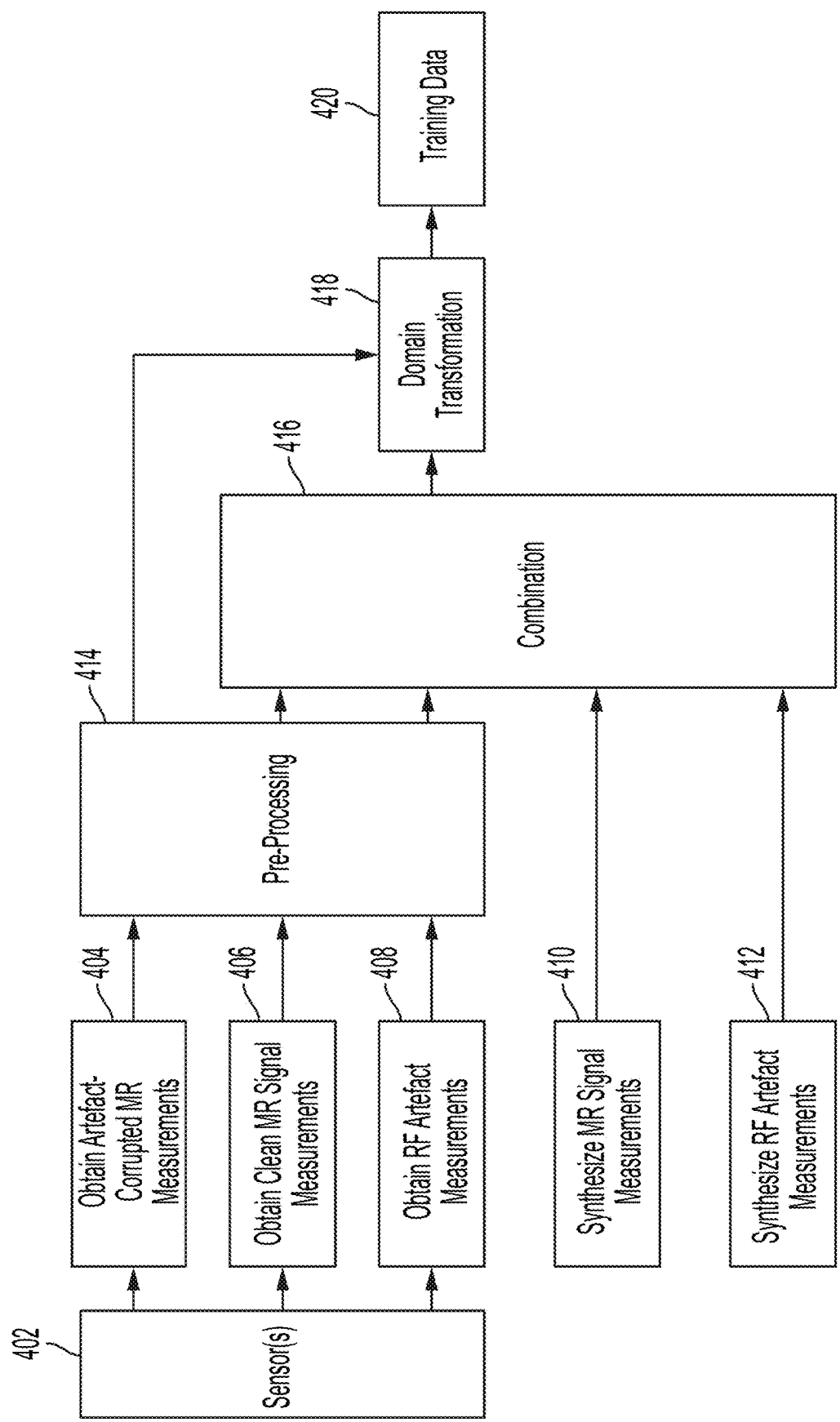
FIG. 4A illustrates techniques for generating training data for training a neural network model for suppressing one or more artefacts in MR data, in accordance with some embodiments of the technology described herein.

FIG. 4A illustrates techniques for generating training data for training a neural network model for suppressing artefacts in MR data, in accordance with some embodiments of the technology described herein.

As shown in FIG. 4A, generating the training data 420 may include: generating RF artefact measurements, generating MR measurements, and combining them using combination block 416 to obtain training data 420.

In some embodiments, generating the RF artefact measurements may include synthesizing RF artefact measurements 412 (e.g., using one or more generative statistical models, one or more physics-based models, etc.). In some embodiments, generating the RF artefact measurements may include using one or more sensors 402 to obtain RF artefact measurements 408.

In some embodiments, generating the MR measurements may include synthesizing the MR measurements 410 (e.g., using one or more generative statistical models, one or more physics-based models, etc.). In some embodiments, generating the MR measurements may include using one or more sensors 402 to obtain clean RF MR measurements 406 and/or artefact corrupted measurements 404. The measurements may be of a real subject (e.g., a patient) and/or of an object (e.g., a phantom).

In some embodiments, any measurements obtained using sensors 402 may be pre-processed. For example, the measurements may be resampled, compressed, pre-denoised, pre-whitened, filtered, amplified and/or pre-processed in any other suitable way.

In some embodiments, the MR and RF artefact measurements may be transformed to any suitable domain via domain transformation 418. For example, the measurements may be transformed into any other domain using analytical or learned transformations (e.g., Fourier transform, wavelet transform, etc.)

In some embodiments, after the training data is collected, the artefact-corrupted data (input) is paired with its clean version (target) and used to estimate parameters of a neural network model using any of the above-described optimization algorithms.

Figure 4B:
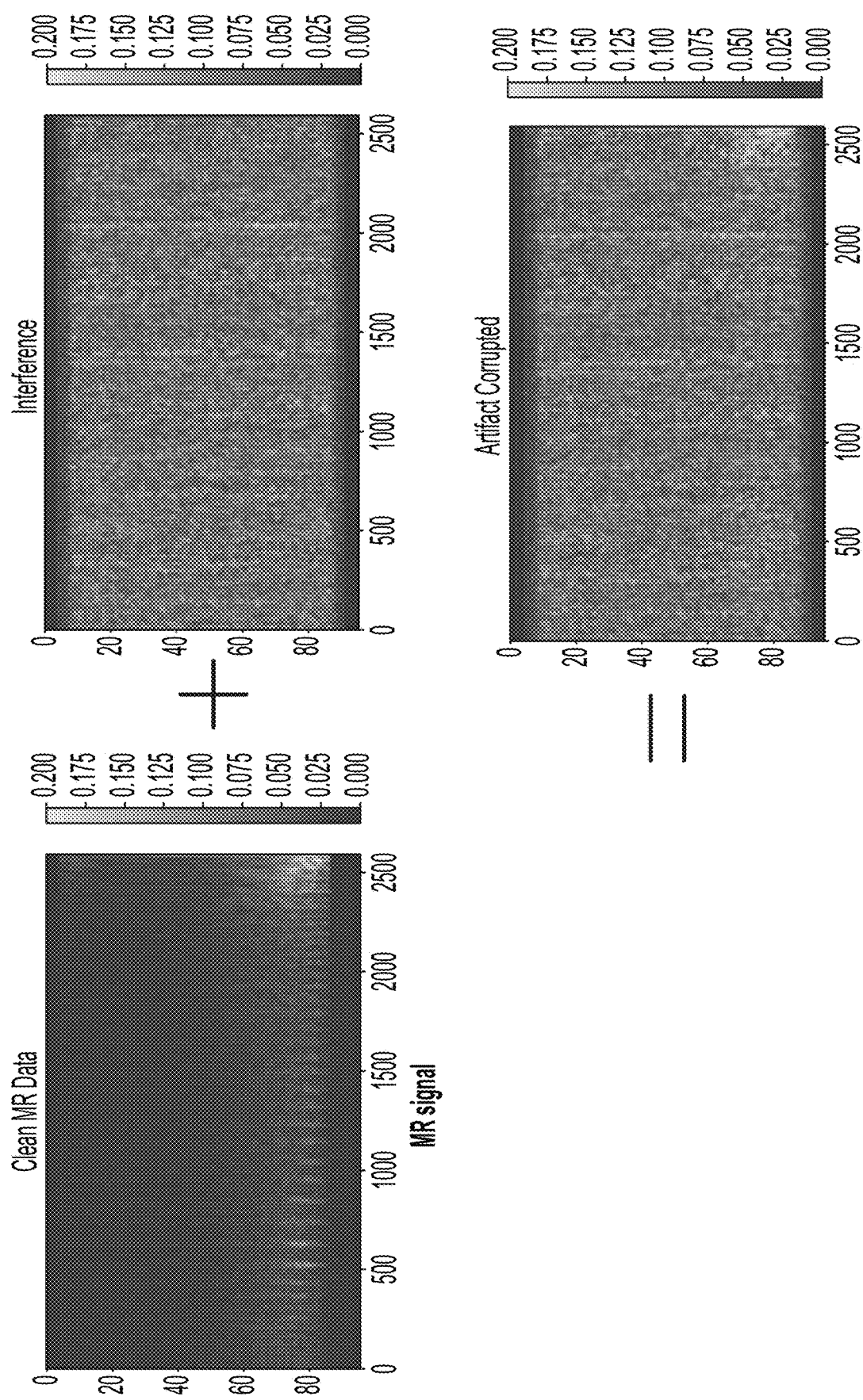
FIG. 4B shows an illustrative example for generating training data for training a neural network model for suppressing one or more artefacts in MR data, in accordance with some embodiments of the technology described herein.

FIG. 4B shows an illustrative example for generating training data for training a neural network model for suppressing artefacts in MR data, in accordance with some embodiments of the technology described herein.

Figure 5:
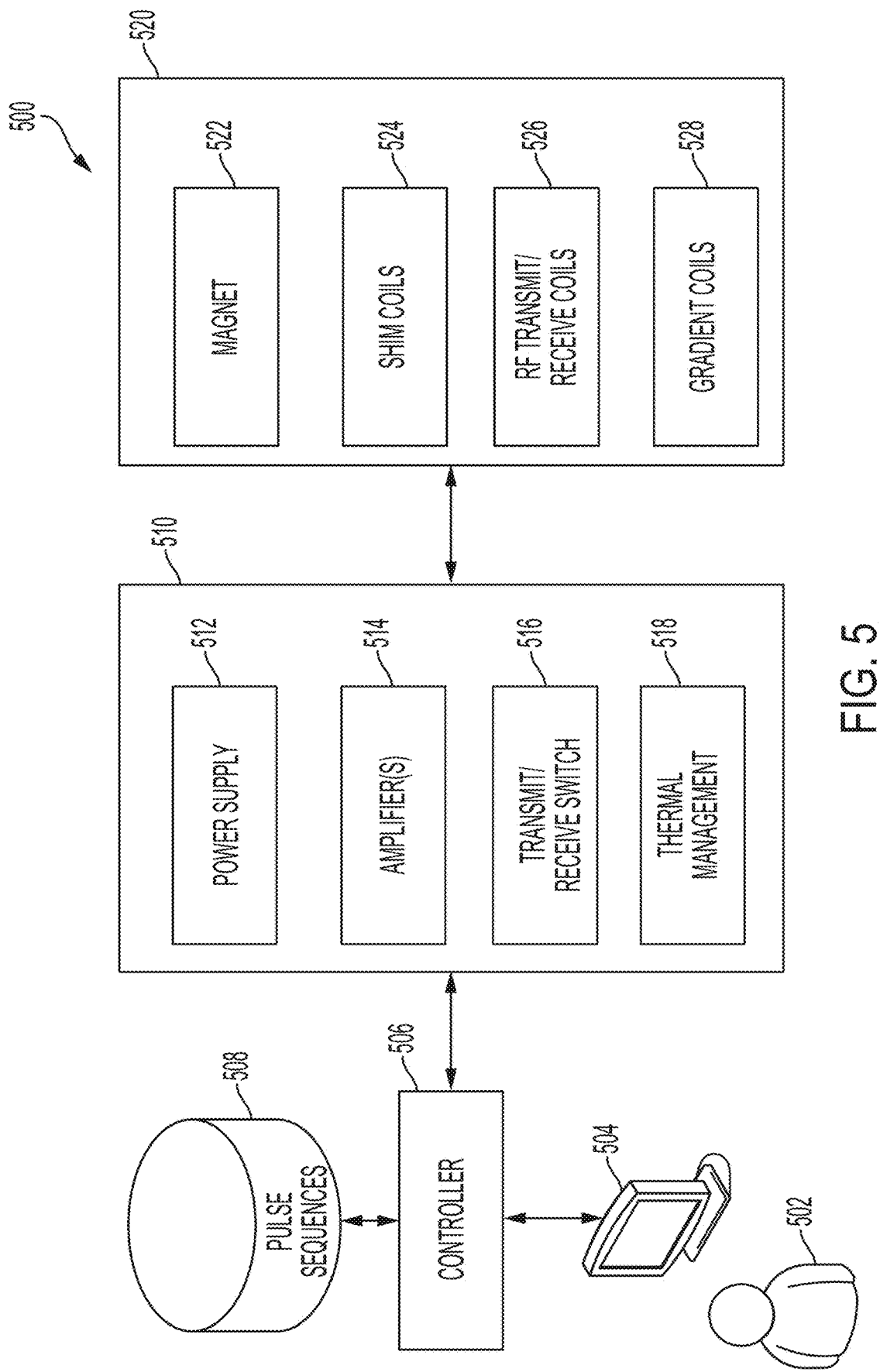
FIG. 5 is a schematic illustration of a low-field MRI system, in accordance with some embodiments of the technology described herein.

FIG. 5 is a block diagram of exemplary components of a MRI system 500. In the illustrative example of FIG. 5, MRI system 500 comprises workstation 504, controller 506, pulse sequences store 508, power management system 510, and magnetic components 520. It should be appreciated that system 500 is illustrative and that an MRI system may have one or more other components of any suitable type in addition to or instead of the components illustrated in FIG. 5.

As illustrated in FIG. 5, magnetic components 520 comprises $B_0$ magnet 522, shim coils 524, RF transmit and receive coils 526, and gradient coils 528. $B_0$ magnet 522 may be used to generate, at least in part, the main magnetic field $B_0$. $B_0$ magnet 522 may be any suitable type of magnet that can generate a main magnetic field (e.g., a low-field strength of approximately 0.2 T or less), and may include one or more $B_0$ coils, correction coils, etc. Shim coils 524 may be used to contribute magnetic field(s) to improve the homogeneity of the $B_0$ field generated by magnet 522.

Gradient coils 528 may be arranged to provide gradient fields and, for example, may be arranged to generate gradients in the magnetic field in three substantially orthogonal directions (X, Y, Z) to localize where MR signals are induced.

RF transmit and receive coils 526 may comprise one or more transmit coils that may be used to generate RF pulses to induce a magnetic field $B_1$. The transmit/receive coil(s) may be configured to generate any suitable type of RF pulses configured to excite an MR response in a subject and detect the resulting MR signals emitted. RF transmit and receive coils 526 may include one or multiple transmit coils and one or multiple receive coils. The configuration of the transmit/receive coils varies with implementation and may include a single coil for both transmitting and receiving, separate coils for transmitting and receiving, multiple coils for transmitting and/or receiving, or any combination to achieve single channel or parallel MRI systems. Thus, the transmit/receive magnetic component is often referred to as Tx/Rx or Tx/Rx coils to generically refer to the various configurations for the transmit and receive component of an MRI system.

Each of magnetics components 520 may be of any suitable type and may be constructed in any suitable way. For example, in some embodiments, the $B_0$ magnet 522 may be an electromagnet or a permanent magnet (e.g., as described below with reference to FIGS. 6, 7, and 8A-B). As another example, in some embodiments, one or more magnetics components 520 (e.g., shim coils 524 and/or gradient coils 528) may be fabricated using the laminate techniques.

Power management system 510 includes electronics to provide operating power to one or more components of the low-field MRI system 500. For example, power management system 510 may include one or more power supplies, gradient power amplifiers, transmit coil amplifiers, and/or any other suitable power electronics needed to provide suitable operating power to energize and operate components of the low-field MRI system 500.

As illustrated in FIG. 5, power management system 510 comprises power supply 512, amplifier(s) 514, transmit/receive switch 516, and thermal management components 518. Power supply 512 includes electronics to provide operating power to magnetic components 520 of the low-field MRI system 500. For example, in some embodiments, power supply 512 may include electronics to provide operating power to one or more $B_0$ coils (e.g., $B_0$ magnet 522) to produce the main magnetic field for the low-field MRI system, one or more shim coils 524, and/or one or more gradient coils 528. In some embodiments, power supply 512 may be a unipolar, continuous wave (CW) power supply, however, any suitable power supply may be used. Transmit/receive switch 516 may be used to select whether RF transmit coils or RF receive coils are being operated.

In some embodiments, amplifier(s) 514 may include one or more RF receive (Rx) pre-amplifiers that amplify MR signals detected by one or more RF receive coils (e.g., coils 524), one or more RF transmit (Tx) amplifiers configured to provide power to one or more RF transmit coils (e.g., coils 526), one or more gradient power amplifiers configured to provide power to one or more gradient coils (e.g., gradient coils 528), and/or one or more shim amplifiers configured to provide power to one or more shim coils (e.g., shim coils 524).

In some embodiments, thermal management components 518 provide cooling for components of low-field MRI system 500 and may be configured to do so by facilitating the transfer of thermal energy generated by one or more components of the low-field MRI system 500 away from those components. Thermal management components 518 may include, without limitation, components to perform water-based or air-based cooling, which may be integrated with or arranged in close proximity to MRI components that generate heat including, but not limited to, $B_0$ coils, gradient coils, shim coils, and/or transmit/receive coils. Thermal management components 518 may include any suitable heat transfer medium including, but not limited to, air and water, to transfer heat away from components of the low-field MRI system 500.

As illustrated in FIG. 5, low-field MRI system 500 includes controller 506 (also referred to as a console) having control electronics to send instructions to and receive information from power management system 510. Controller 506 may be configured to implement one or more pulse sequences, which are used to determine the instructions sent to power management system 510 to operate the magnetic components 520 in a desired sequence. For example, controller 506 may be configured to control the power management system 510 to operate the magnetic components 520 in accordance with a balanced steady-state free precession (bSSFP) pulse sequence, a low-field gradient echo pulse sequence, a low-field spin echo pulse sequence, a low-field inversion recovery pulse sequence, arterial spin labeling, diffusion weighted imaging (DWI), and/or any other suitable pulse sequence. Controller 506 may be implemented as hardware, software, or any suitable combination of hardware and software, as aspects of the disclosure provided herein are not limited in this respect.

In some embodiments, controller 506 may be configured to implement a pulse sequence by obtaining information about the pulse sequence from pulse sequences repository 508, which stores information for each of one or more pulse sequences. Information stored by pulse sequences repository 508 for a particular pulse sequence may be any suitable information that allows controller 506 to implement the particular pulse sequence. For example, information stored in pulse sequences repository 508 for a pulse sequence may include one or more parameters for operating magnetics components 520 in accordance with the pulse sequence (e.g., parameters for operating the RF transmit and receive coils 526, parameters for operating gradient coils 528, etc.), one or more parameters for operating power management system 510 in accordance with the pulse sequence, one or more programs comprising instructions that, when executed by controller 506, cause controller 506 to control system 500 to operate in accordance with the pulse sequence, and/or any other suitable information. Information stored in pulse sequences repository 508 may be stored on one or more non-transitory storage media.

As illustrated in FIG. 5, in some embodiments, controller 506 may interact with computing device 504 programmed to process received MR data (which, in some embodiments, may be sensor or spatial frequency domain MR data). For example, computing device 504 may process received MR data to generate one or more MR images using any suitable image reconstruction process(es) including using any of the techniques described herein that make use of neural network models to generate MR images from input MR data. For example, computing device 504 may perform any of the processes described herein with reference to FIG. 3. Controller 506 may provide information about one or more pulse sequences to computing device 504 for the processing of data by the computing device. For example, controller 506 may provide information about one or more pulse sequences to computing device 504 and the computing device may perform an image reconstruction process based, at least in part, on the provided information.

In some embodiments, computing device 504 may be any electronic device or devices configured to process acquired MR data and generate one or more images of the subject being imaged. In some embodiments, computing device 504 may include a fixed electronic device such as a desktop computer, a server, a rack-mounted computer, or any other suitable fixed electronic device that may be configured to process MR data and generate one or more images of the subject being imaged. Alternatively, computing device 504 may be a portable device such as a smart phone, a personal digital assistant, a laptop computer, a tablet computer, or any other portable device that may be configured to process MR data and generate one or images of the subject being imaged. In some embodiments, computing device 504 may comprise multiple computing devices of any suitable type, as the aspects of the technology described herein are not limited in this respect.

In some embodiments, a user 502 may interact with computing device 504 to control aspects of the low-field MR system 500 (e.g., program the system 500 to operate in accordance with a particular pulse sequence, adjust one or more parameters of the system 500, etc.) and/or view images obtained by the low-field MR system 500. According to some embodiments, computing device 504 and controller 506 form a single controller, while in other embodiments, computing device 504 and controller 506 each comprise one or more controllers. It should be appreciated that the functionality performed by computing device 504 and controller 506 may be distributed in any way over any combination of one or more controllers, as the aspects of the technology described herein are not limited for use with any particular implementation or architecture.

Figure 6:
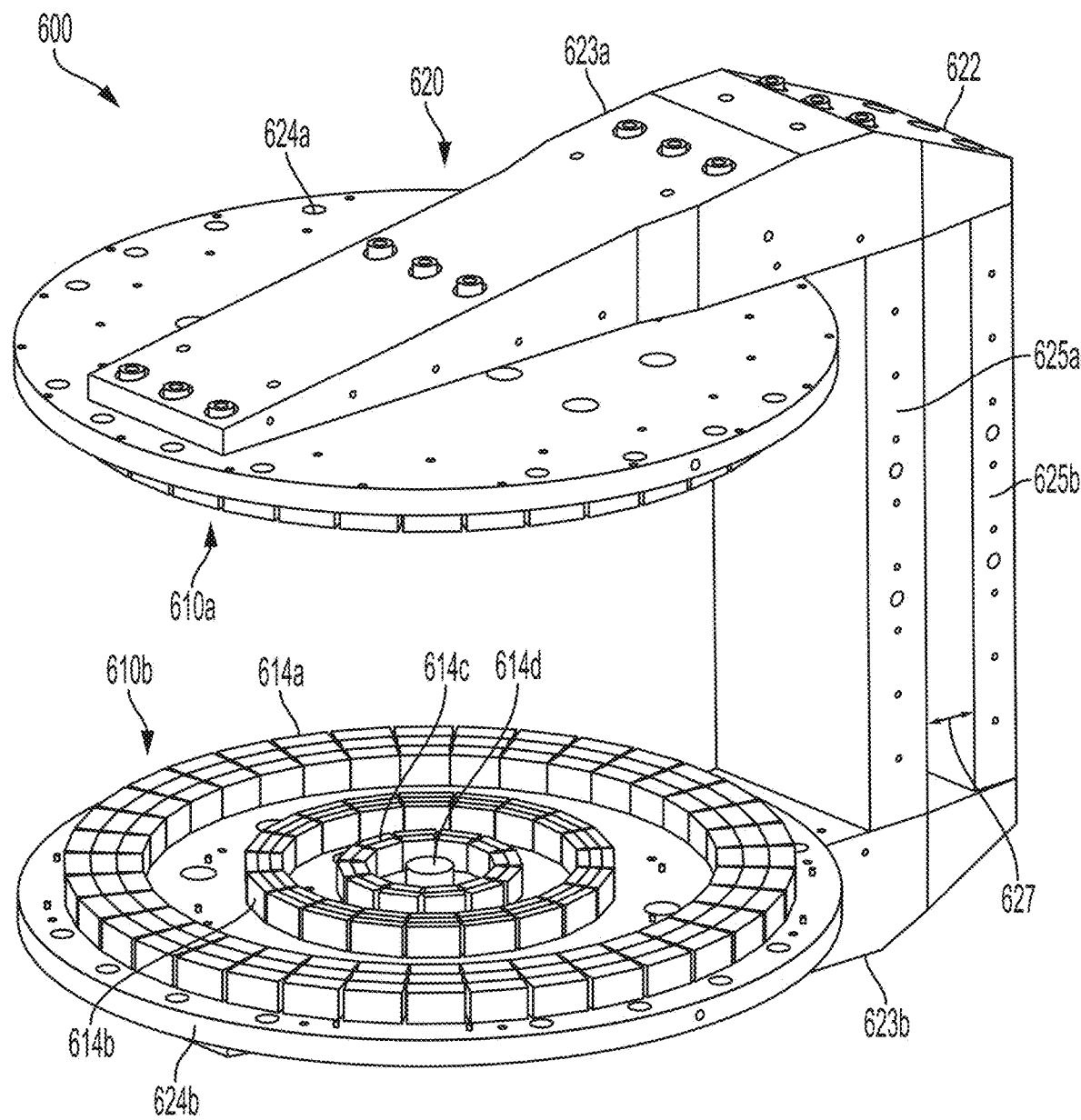
FIGS. 6 and 7 illustrate bi-planar permanent magnet configurations for a $B_0$ magnet, in accordance with some embodiments of the technology described herein.
Figure 7:
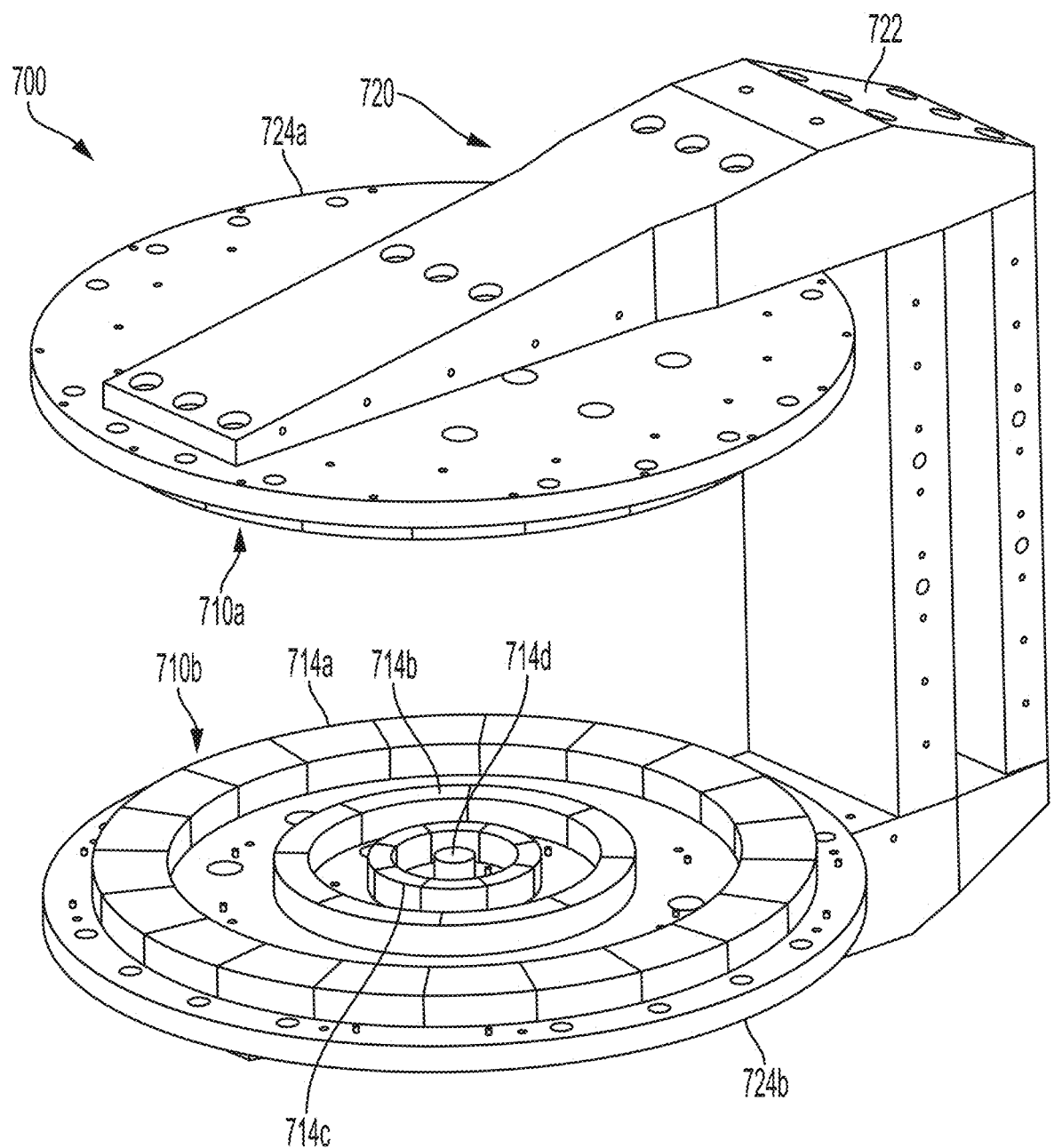

FIGS. 6 and 7 illustrate bi-planar permanent magnet configurations for a $B_0$ magnet, in accordance with some embodiments of the technology described herein. FIG. 6 illustrates a permanent $B_0$ magnet 600, in accordance with some embodiments. In the illustrated embodiment, $B_0$ magnet 600 is formed by permanent magnets 610a and 610b arranged in a bi-planar geometry and a yoke 620 that captures electromagnetic flux produced by the permanent magnets and transfers the flux to the opposing permanent magnet to increase the flux density between permanent magnets 610a and 610b. Each of permanent magnets 610a and 610b is formed from a plurality of concentric permanent magnet rings. In particular, as visible in FIG. 6, permanent magnet 610b comprises an outer ring of permanent magnets 614a, a middle ring of permanent magnets 614b, an inner ring of permanent magnets 614c, and a permanent magnet disk 614d at the center. Though shown with four concentric permanent magnet rings, permanent magnet 610b (and permanent magnet 610a) may have any suitable number of permanent magnet rings, as aspects of the technology described herein are not limited in this respect. Permanent magnet 610a may be formed substantially identically to permanent magnet 610b and, for example, comprise the same set of permanent magnet rings as permanent magnet 610b.

The permanent magnet material used may be selected depending on the design requirements of the system. For example, according to some embodiments, the permanent magnets (or some portion thereof) may be made of NdFeB, which produces a magnetic field with a relatively high magnetic field per unit volume of material once magnetized. In some embodiments, SmCo material is used to form the permanent magnets, or some portion thereof. While NdFeB produces higher field strengths (and in general is less expensive than SmCo), SmCo exhibits less thermal drift and thus provides a more stable magnetic field in the face of temperature fluctuations. Other types of permanent magnet material(s) may be used as well, as the aspects of the technology described herein are not limited in this respect. In general, the type or types of permanent magnet material utilized will depend, at least in part, on the field strength, temperature stability, weight, cost and/or ease of use requirements of a given $B_0$ magnet implementation.

In some embodiments, the permanent magnet rings are sized and arranged to produce a homogenous field of a desired strength in the imaging region (field of view) between permanent magnets 610a and 610b. In the exemplary embodiment illustrated in FIG. 6A, each permanent magnet ring comprises a plurality segments, each segment formed using a plurality of permanent magnet blocks stacked in the radial direction and positioned adjacent to one another about the periphery to form the respective ring. The inventors have appreciated that by varying the width (in the direction tangent to the ring) of each permanent magnet, less waste of useful space may be achieved while using less material. For example, the space between stacks that does not produce useful magnetic fields can be reduced by varying the width of the blocks, for example, as function of the radial position of the block, allowing for a closer fit to reduce wasted space and maximize the amount of magnetic field that can be generated in a given space. The dimensions of the blocks may also be varied in any desired way to facilitate the production of a magnetic field of desired strength and homogeneity. For example, in some embodiments, the heights of the blocks different rings may be different from one another and/or the heights of one or more blocks within a particular ring may be different from one another in order to achieve a magnetic field of desired strength and homogeneity.

As shown in FIG. 6, $B_0$ magnet 600 further comprises yoke 620 configured and arranged to capture magnetic flux generated by permanent magnets 610a and 610b and direct it to the opposing side of the $B_0$ magnet to increase the flux density in between permanent magnets 610a and 610b, increasing the field strength within the field of view of the $B_0$ magnet. By capturing magnetic flux and directing it to the region between permanent magnets 610a and 610b, less permanent magnet material can be used to achieve a desired field strength, thus reducing the size, weight and cost of the $B_0$ magnet 600. Alternatively, for given permanent magnets, the field strength can be increased, thus improving the SNR of the system without having to use increased amounts of permanent magnet material. For exemplary $B_0$ magnet 600, yoke 620 comprises a frame 622 and plates 624a and 624b. Plates 624a and 624b may capture magnetic flux generated by permanent magnets 610a and 610b and direct it to frame 622 to be circulated via the magnetic return path of the yoke to increase the flux density in the field of view of the $B_0$ magnet. Yoke 620 may be constructed of any desired ferromagnetic material, for example, low carbon steel, CoFe and/or silicon steel, etc. to provide the desired magnetic properties for the yoke. In some embodiments, plates 624a and 624b (and/or frame 622 or portions thereof) may be constructed of silicon steel or the like in areas where the gradient coils could most prevalently induce eddy currents.

Exemplary frame 622 comprises arms 623a and 623b that attach to plates 624a and 624b, respectively, and supports 625a and 625b providing the magnetic return path for the flux generated by the permanent magnets. The arms are generally designed to reduce the amount of material needed to support the permanent magnets while providing sufficient cross-section for the return path for the magnetic flux generated by the permanent magnets. Frame 622 has two supports within a magnetic return path for the $B_0$ field produced by the $B_0$ magnet. Supports 625a and 625b are produced with a gap 627 formed between, providing a measure of stability to the frame and/or lightness to the structure while providing sufficient cross-section for the magnetic flux generated by the permanent magnets. For example, the cross-section needed for the return path of the magnetic flux can be divided between the two support structures, thus providing a sufficient return path while increasing the structural integrity of the frame.

FIG. 7 illustrates a $B_0$ magnet 700, in accordance with some embodiments. $B_0$ magnet 2200 may share design components with $B_0$ magnet 600 illustrated in FIG. 6. In particular, $B_0$ magnet 700 is formed by permanent magnets 710a and 710b arranged in a bi-planar geometry with a yoke 720 coupled thereto to capture electromagnetic flux produced by the permanent magnets and transfer the flux to the opposing permanent magnet to increase the flux density between permanent magnets 710a and 710b. Each of permanent magnets 710a and 710b is formed from a plurality of concentric permanent magnets, as shown by permanent magnet 710b comprising an outer ring of permanent magnets 714a, a middle ring of permanent magnets 714b, an inner ring of permanent magnets 714c, and a permanent magnet disk 714d at the center. Permanent magnet 710a may comprise the same set of permanent magnet elements as permanent magnet 710b. The permanent magnet material used may be selected depending on the design requirements of the system (e.g., NdFeB, SmCo, etc. depending on the properties desired).

The permanent magnet rings are sized and arranged to produce a homogenous field of a desired strength in the central region (field of view) between permanent magnets 710a and 710b. In the exemplary embodiment of FIG. 7, each permanent magnet ring comprises a plurality of circular arc segments sized and positioned to produce a desired $B_0$ magnetic field. In a similar manner to yoke 620 illustrated in FIG. 6, yoke 720 is configured and arranged to capture magnetic flux generated by permanent magnets 710a and 710b and direct it to the opposing side of the $B_0$ magnet to increase the flux density between permanent magnets 710a and 710b. Yoke 720 thereby increases the field strength within the field of view of the $B_0$ magnet with less permanent magnet material, reducing the size, weight and cost of the $B_0$ magnet. Yoke 720 also comprises a frame 722 and plates 724a and 724b that, in a manner similar to that described above in connection with yoke 720, captures and circulates magnetic flux generated by the permanent magnets 710a and via the magnetic return path of the yoke to increase the flux density in the field of view of the $B_0$ magnet. The structure of yoke 720 may be similar to that described above to provide sufficient material to accommodate the magnetic flux generated by the permanent magnets and providing sufficient stability, while minimizing the amount of material used to, for example, reduce the cost and weight of the $B_0$ magnet.

Because a permanent $B_0$ magnet, once magnetized, will produce its own persistent magnetic field, power is not required to operate the permanent $B_0$ magnet to generate its magnetic field. As a result, a significant (often dominant) contributor to the overall power consumption of an MRI system is eliminated through the use of a permanent magnet (as opposed to, e.g., an electro-magnet which requires power), facilitating the development of an MRI system that can be powered using mains electricity (e.g., via a standard wall outlet or common large household appliance outlets). As described above, the inventors have developed low power, portable low-field MRI systems that can be deployed in virtually any environment and that can be brought to the patient who will undergo an imaging procedure. In this way, patients in emergency rooms, intensive care units, operating rooms and a host of other locations can benefit from MRI in circumstances where MRI is conventionally unavailable.

Figure 8B:
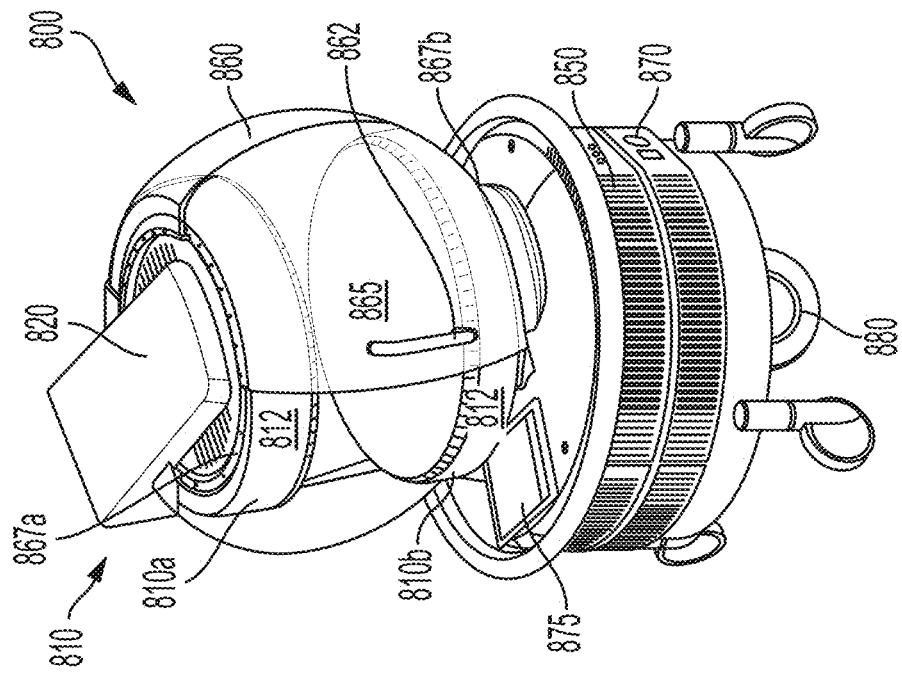
FIGS. 8A and 8B illustrate views of a portable MRI system, in accordance with some embodiments of the technology described herein.
Figure 8A:
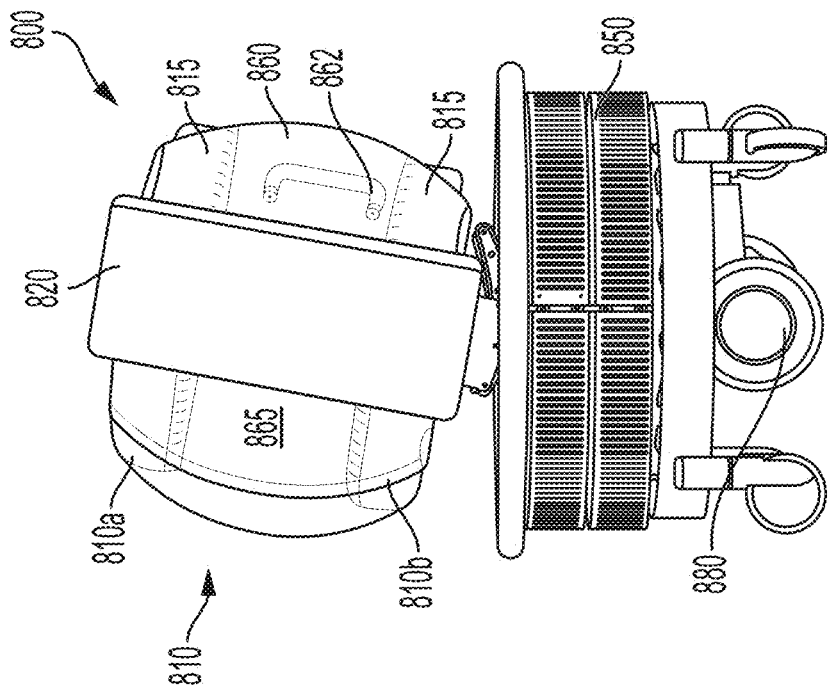

FIGS. 8A and 8B illustrate views of a portable MRI system 800, in accordance with some embodiments of the technology described herein. Portable MRI system 800 comprises a $B_0$ magnet 810 formed in part by an upper magnet 810a and a lower magnet 810b having a yoke 820 coupled thereto to increase the flux density within the imaging region. The $B_0$ magnet 810 may be housed in magnet housing 812 along with gradient coils 815 (e.g., any of the gradient coils described in U.S. application Ser. No. 14/845,652, titled "Low Field Magnetic Resonance Imaging Methods and Apparatus" and filed on Sep. 4, 2015, which is herein incorporated by reference in its entirety). In some embodiments, $B_0$ magnet 810 comprises an electromagnet. In some embodiments, $B_0$ magnet 810 comprises a permanent magnet (e.g., any permanent magnet described in U.S. application Ser. No. 15/640,369, titled "LOW-FIELD MAGNETIC RESONANCE IMAGING METHODS AND APPARATUS," filed on Jun. 30, 2017, which is incorporated by reference herein in its entirety). For example, in some embodiments, $B_0$ magnet 810 may be the permanent magnet 600 described with reference to FIG. 6 or the permanent magnet 700 described with reference to FIG. 7.

Illustrative portable MRI system 800 further comprises a base 850 housing the electronics that operates the MRI system. For example, base 850 may house electronics including, but not limited to, one or more gradient power amplifiers, an on-system computer, a power distribution unit, one or more power supplies, and/or any other power components configured to operate the MRI system using mains electricity (e.g., via a connection to a standard wall outlet and/or a large appliance outlet). For example, base 870 may house low power components, such as those described herein, enabling at least in part the portable MRI system to be powered from readily available wall outlets. Accordingly, portable MRI system 800 can be brought to the patient and plugged into a wall outlet in his or her vicinity.

Portable MRI system 800 further comprises moveable slides 860 that can be opened and closed and positioned in a variety of configurations. Slides 860 include electromagnetic shielding 865, which can be made from any suitable conductive or magnetic material, to form a moveable shield to attenuate electromagnetic noise in the operating environment of the portable MRI system to shield the imaging region from at least some electromagnetic noise. As used herein, the term electromagnetic shielding refers to conductive or magnetic material configured to attenuate the electromagnetic field in a spectrum of interest and positioned or arranged to shield a space, object and/or component of interest. In the context of an MRI system, electromagnetic shielding may be used to shield electronic components (e.g., power components, cables, etc.) of the MRI system, to shield the imaging region (e.g., the field of view) of the MRI system, or both.

The degree of attenuation achieved from electromagnetic shielding depends on a number of factors including the type material used, the material thickness, the frequency spectrum for which electromagnetic shielding is desired or required, the size and shape of apertures in the electromagnetic shielding (e.g., the size of the spaces in a conductive mesh, the size of unshielded portions or gaps in the shielding, etc.) and/or the orientation of apertures relative to an incident electromagnetic field. Thus, electromagnetic shielding refers generally to any conductive or magnetic barrier that acts to attenuate at least some electromagnetic radiation and that is positioned to at least partially shield a given space, object or component by attenuating the at least some electromagnetic radiation.

It should be appreciated that the frequency spectrum for which shielding (attenuation of an electromagnetic field) is desired may differ depending on what is being shielded. For example, electromagnetic shielding for certain electronic components may be configured to attenuate different frequencies than electromagnetic shielding for the imaging region of the MRI system. Regarding the imaging region, the spectrum of interest includes frequencies which influence, impact and/or degrade the ability of the MRI system to excite and detect an MR response. In general, the spectrum of interest for the imaging region of an MRI system correspond to the frequencies about the nominal operating frequency (i.e., the Larmor frequency) at a given $B_0$ magnetic field strength for which the receive system is configured to or capable of detecting. This spectrum is referred to herein as the operating spectrum for the MRI system. Thus, electromagnetic shielding that provides shielding for the operating spectrum refers to conductive or magnetic material arranged or positioned to attenuate frequencies at least within the operating spectrum for at least a portion of an imaging region of the MRI system.

In portable MRI system 800 illustrated in FIGS. 8A and 8B, the moveable shields are thus configurable to provide shielding in different arrangements, which can be adjusted as needed to accommodate a patient, provide access to a patient, and/or in accordance with a given imaging protocol. For example, for an imaging procedure such as a brain scan, once the patient has been positioned, slides 860 can be closed, for example, using handle 862 to provide electromagnetic shielding 865 around the imaging region except for the opening that accommodates the patient's upper torso. As another example, for an imaging procedure such as a knee scan, slides 860 may be arranged to have openings on both sides to accommodate the patient's leg or legs. Accordingly, moveable shields allow the shielding to be configured in arrangements suitable for the imaging procedure and to facilitate positioning the patient appropriately within the imaging region.

In some embodiments, a noise reduction system comprising one or more noise reduction and/or compensation techniques may be performed to suppress at least some of the electromagnetic noise that is not blocked or sufficiently attenuated by shielding 865. In particular, the inventors have developed noise reduction systems configured to suppress, avoid and/or reject electromagnetic noise in the operating environment in which the MRI system is located. According to some embodiments, these noise suppression techniques work in conjunction with the moveable shields to facilitate operation in the various shielding configurations in which the slides may be arranged. For example, when slides 960 are opened, increased levels of electromagnetic noise will likely enter the imaging region via the openings. As a result, the noise suppression component will detect increased electromagnetic noise levels and adapt the noise suppression and/or avoidance response accordingly. Due to the dynamic nature of the noise suppression and/or avoidance techniques described herein, the noise reduction system is configured to be responsive to changing noise conditions, including those resulting from different arrangements of the moveable shields. Thus, a noise reduction system in accordance with some embodiments may be configured to operate in concert with the moveable shields to suppress electromagnetic noise in the operating environment of the MRI system in any of the shielding configurations that may be utilized, including configurations that are substantially without shielding (e.g., configurations without moveable shields).

To ensure that the moveable shields provide shielding regardless of the arrangements in which the slides are placed, electrical gaskets may be arranged to provide continuous shielding along the periphery of the moveable shield. For example, as shown in FIG. 8B, electrical gaskets 867a and 867b may be provided at the interface between slides 860 and magnet housing to maintain to provide continuous shielding along this interface. According to some embodiments, the electrical gaskets are beryllium fingers or beryllium-copper fingers, or the like (e.g., aluminum gaskets), that maintain electrical connection between shields 865 and ground during and after slides 860 are moved to desired positions about the imaging region.

To facilitate transportation, a motorized component 880 is provide to allow portable MRI system to be driven from location to location, for example, using a control such as a joystick or other control mechanism provided on or remote from the MRI system. In this manner, portable MRI system 800 can be transported to the patient and maneuvered to the bedside to perform imaging.

The portable MRI systems described herein may be operated from a portable electronic device, such as a notepad, tablet, smartphone, etc. For example, tablet computer 875 may be used to operate portable MRI system to run desired imaging protocols and to view the resulting images. Tablet computer 875 may be connected to a secure cloud to transfer images for data sharing, telemedicine, and/or deep learning on the data sets. Any of the techniques of utilizing network connectivity described in U.S. application Ser. No. 14/846,158, titled "Automatic Configuration of a Low Field Magnetic Resonance Imaging System," filed Sep. 4, 2015, which is herein incorporated by reference in its entirety, may be utilized in connection with the portable MRI systems described herein.

Figure 9A:
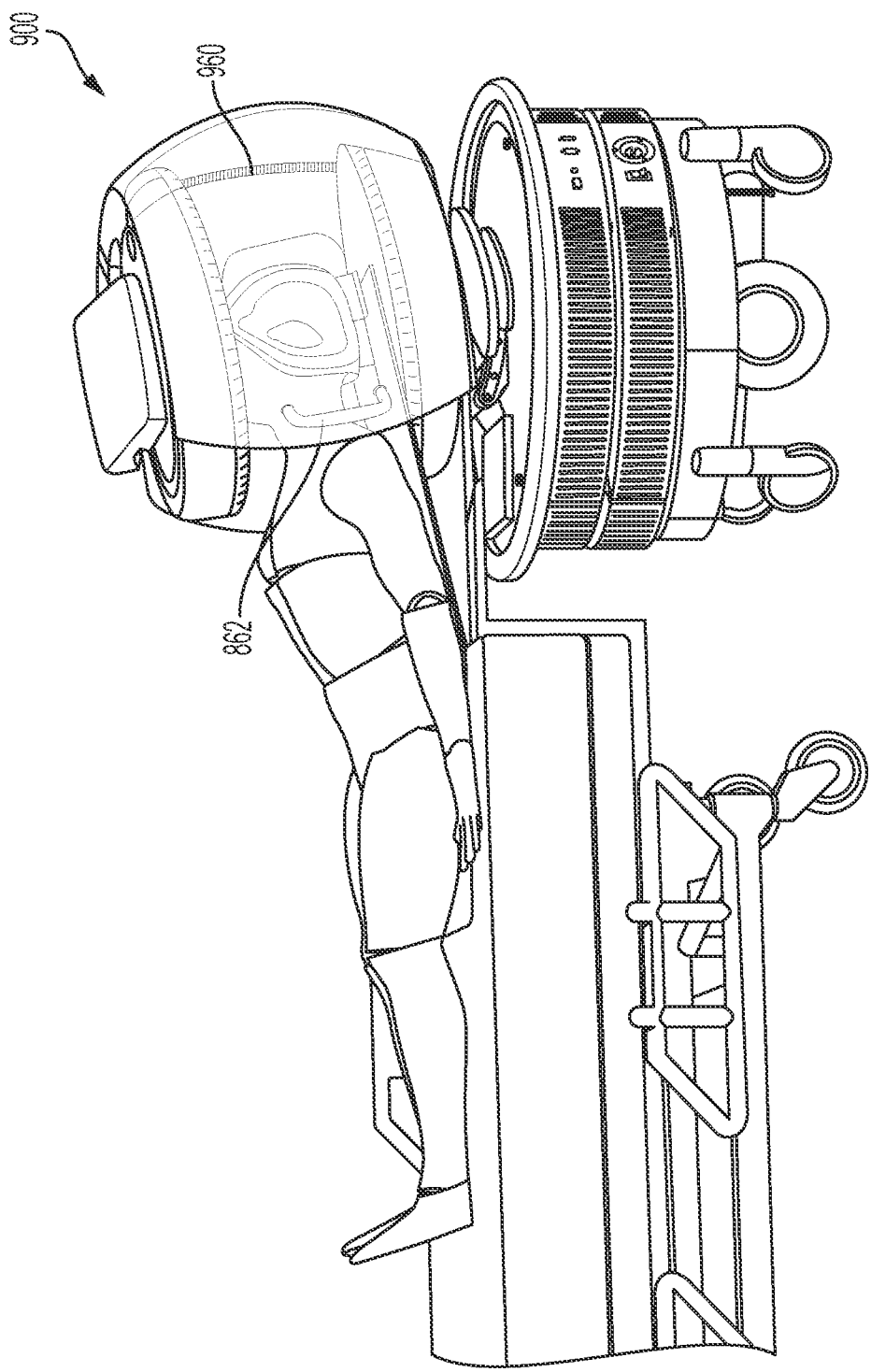
FIG. 9A illustrates a portable MRI system performing a scan of the head, in accordance with some embodiments of the technology described herein.
Figure 9B:
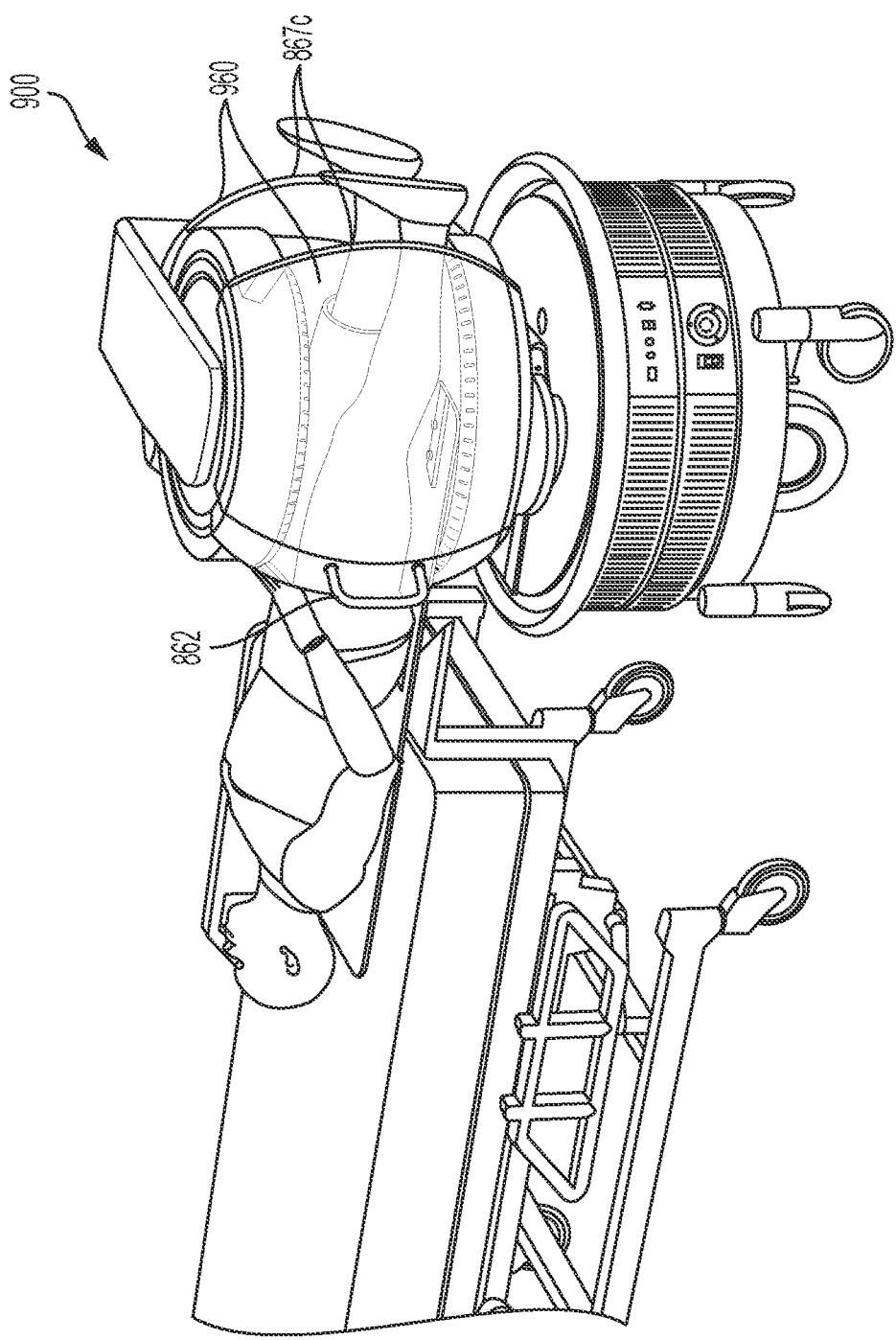
FIG. 9B illustrates a portable MRI system performing a scan of the knee, in accordance with some embodiments of the technology described herein.

As described above, FIG. 9A illustrates a portable MRI system 900 that has been transported to a patient's bedside to perform a brain scan. FIG. 9B illustrates portable MRI system 900 that has been transported to a patient's bedside to perform a scan of the patient's knee. As shown in FIG. 9B, shield 960 have electrical gaskets 867c.

It should be appreciated that the electromagnetic shields illustrated in FIGS. 8A-8B and 9A-9B are exemplary and providing shielding for an MRI system is not limited to the example electromagnetic shielding described herein. Electromagnetic shielding can be implemented in any suitable way using any suitable materials. For example, electromagnetic shielding may be formed using conductive meshes, fabrics, etc. that can provide a moveable "curtain" to shield the imaging region. Electromagnetic shielding may be formed using one or more conductive straps (e.g., one or more strips of conducting material) coupled to the MRI system as either a fixed, moveable or configurable component to shield the imaging region from electromagnetic interference, some examples of which are described in further detail below. Electromagnetic shielding may be provided by embedding materials in doors, slides, or any moveable or fixed portion of the housing. Electromagnetic shields may be deployed as fixed or moveable components, as the aspects are not limited in this respect.

Figure 10:
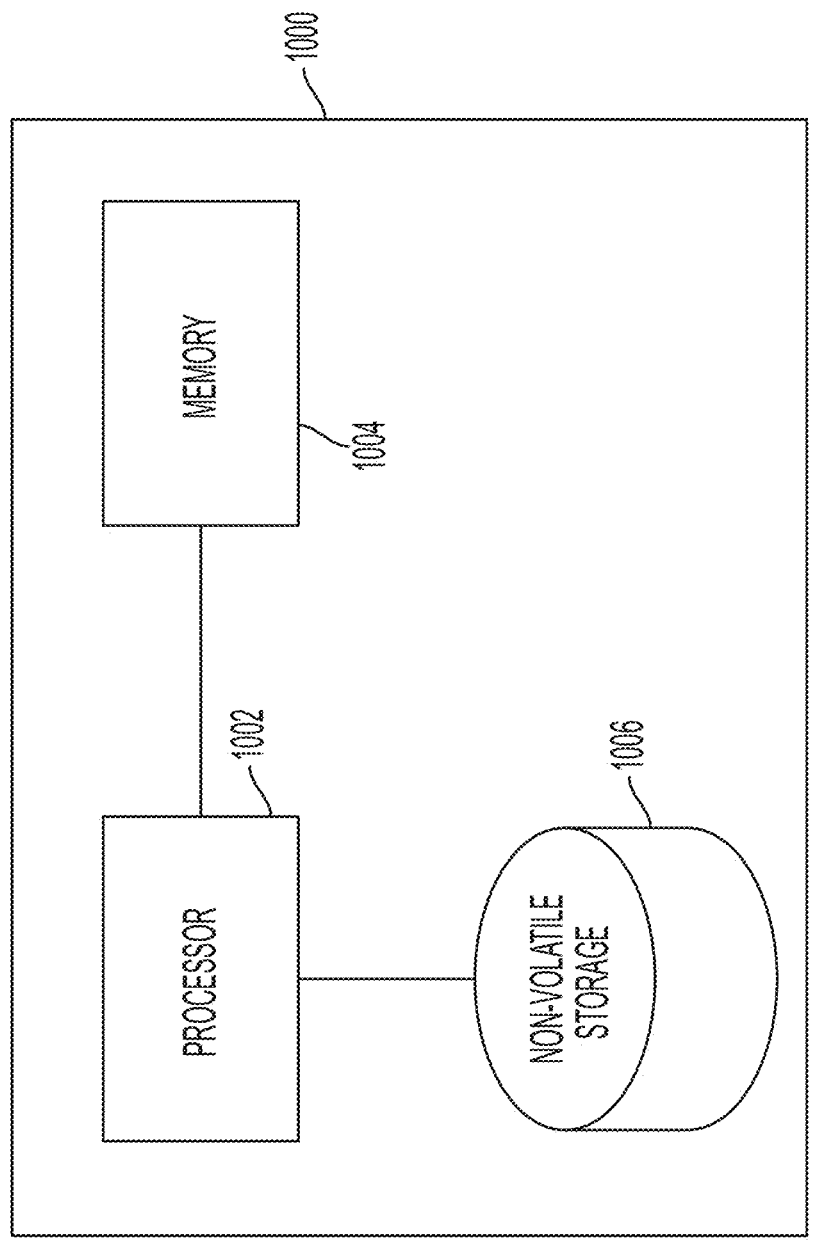
FIG. 10 is a diagram of an illustrative computer system on which embodiments described herein may be implemented.

FIG. 10 is a diagram of an illustrative computer system on which embodiments described herein may be implemented. An illustrative implementation of a computer system 1000 that may be used in connection with any of the embodiments of the disclosure provided herein is shown in FIG. 10. For example, the processes described with reference to FIGS. 3 and 4A may be implemented on and/or using computer system 1000. As another example, the computer system 1000 may be used to train and/or use any of the neural network statistical models described herein. The computer system 1000 may include one or more processors 1002 and one or more articles of manufacture that comprise non-transitory computer-readable storage media (e.g., memory 1004 and one or more non-volatile storage media 1006). The processor 1002 may control writing data to and reading data from the memory 1004 and the non-volatile storage device 1006 in any suitable manner, as the aspects of the disclosure provided herein are not limited in this respect. To perform any of the functionality described herein, the processor 1002 may execute one or more processor-executable instructions stored in one or more non-transitory computer-readable storage media (e.g., the memory 1004), which may serve as non-transitory computer-readable storage media storing processor-executable instructions for execution by the processor 1002.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, within ±2% of a target value in some embodiments. The terms "approximately" and "about" may include the target value.

What is claimed is:

1. A method, comprising:
    obtaining input magnetic resonance (MR) data using at least one radio-frequency (RF) coil of a magnetic resonance imaging (MRI) system; and
    generating an MR image from the input MR data at least in part by using a neural network model to suppress RF interference in the input MR data, wherein the generating comprises:
        performing a reconstruction step by generating an image in an image domain from the input MR data; and
        using the neural network model to suppress the RF interference in the input MR data by processing the input MR data before the reconstruction step in a domain other than the image domain,
    wherein the neural network model comprises:
        a first neural network portion configured to suppress the RF interference in the input MR data in the domain other than the image domain before the reconstruction step, the first neural network portion comprising one or more convolutional layers; and
        a second neural network portion configured to suppress noise in the input MR data in the domain other than the image domain before the reconstruction step, the second neural network portion comprising one or more convolutional layers.

2. The method of claim 1, wherein the generating further comprises using the neural network model to additionally suppress noise in the input MR data by processing the input MR data before the reconstruction step in the domain other than the image domain, wherein the noise is generated by a circuitry in an MR receiver chain of the MRI system and/or by a subject or object being imaged by the MRI system.

3. The method of claim 1, wherein the RF interference comprises external RF interference generated by a device external to the MRI system.

4. The method of claim 3, wherein the device external to the MRI system includes a medical device located in a same room as the MRI system.

5. The method of claim 1, wherein the MRI system includes an imaging region, and wherein the RF interference comprises internal RF interference generated by at least one component of the MRI system located outside of the imaging region.

6. The method of claim 5, wherein the at least one component of the MRI system includes one or more magnetics components of the MRI system.

7. The method of claim 6, wherein the one or more magnetics components of the MRI system include a gradient coil of the MRI system.

8. The method of claim 1,
    wherein the input MR data is in a spatial frequency domain.

9. The method of claim 1,
    wherein the input MR data is in a sensor domain.

10. The method of claim 1,
    wherein the neural network model comprises a spectral unpooling layer, and
    wherein processing the input MR data with the neural network model comprises applying the spectral unpooling layer.

11. The method of claim 10, wherein the neural network model further comprises a spectral pooling layer, a plurality of convolutional layers, and a skip connection.

12. The method of claim 10, wherein applying the spectral unpooling layer comprises applying a pointwise multiplication layer for combining first features having a first resolution provided via a skip connection with second features having a second resolution lower than the first resolution.

13. The method of claim 1, wherein the neural network model further comprises:
a third neural network portion configured to suppress noise from image-domain data obtained using the input MR data after the reconstruction step.

14. The method of claim 1, further comprising:
obtaining, during a first time period, RF artefact measurements using the at least one RF coil of the MRI system, wherein the RF artefact measurements include measurements of RF interference and/or noise;
obtaining, during a second time period different from the first time period, MR measurements of a subject in the imaging region of the MRI system;
generating artefact-corrupted MR data by combining the RF artefact measurements with the MR measurements of the subject; and
training the neural network model using the artefact-corrupted MR data.

15. The method of claim 1, further comprising:
synthesizing RF artefact measurements, wherein the RF artefact measurements include synthesized measurements of RF interference and/or noise;
obtaining MR measurements of a subject in the imaging region of the MRI system;
generating artefact-corrupted MR data by combining the synthesized RF artefact measurements with the MR measurements of the subject; and
training the neural network model using the artefact-corrupted MR data.

16. A system, comprising:
at least one computer hardware processor; and
at least one non-transitory computer-readable storage medium storing processor executable instructions that, when executed by the at least one computer hardware processor, cause the at least one computer hardware processor to perform:
obtaining input magnetic resonance (MR) data using at least one radio-frequency (RF) coil of a magnetic resonance imaging (MRI) system; and
generating an MR image from the input MR data at least in part by using a neural network model to suppress RF interference in the input MR data, wherein the generating comprises:
performing a reconstruction step by generating an image in an image domain from the input MR data; and
using the neural network model to suppress the RF interference in the input MR data by processing the input MR data before the reconstruction step in a domain other than the image domain
wherein the neural network model comprises:
a first neural network portion configured to suppress the RF interference in the input MR data in the domain other than the image domain before the reconstruction step, the first neural network portion comprising one or more convolutional layers; and
a second neural network portion configured to suppress noise in the input MR data in the domain other than the image domain before the reconstruction step, the second neural network portion comprising one or more convolutional layers.

17. A magnetic resonance imaging (MRI) system, comprising:
magnetic components comprising:
a $B_0$ magnet configured to provide a $B_0$ field for the MRI system;
gradient coils configured to provide gradient fields for the MRI system; and
at least one RF coil configured to detect magnetic resonance (MR) signals;
a controller configured to:
control at least some of the magnetic components to acquire input MR; and
generating an MR image from the input MR data at least in part by using a neural network model to suppress RF interference in the input MR data, wherein the generating comprises:
performing a reconstruction step by generating an image in an image domain from the input MR data; and
using the neural network model to suppress the RF interference in the input MR data by processing the input MR data before the reconstruction step in a domain other than the image domain,
wherein the neural network model comprises:
a first neural network portion configured to suppress the RF interference in the input MR data in the domain other than the image domain before the reconstruction step, the first neural network portion comprising one or more convolutional layers; and
a second neural network portion configured to suppress noise in the input MR data in the domain other than the image domain before the reconstruction step, the second neural network portion comprising one or more convolutional layers.

* * * * *